(12) United States Patent
Yamane

(10) Patent No.: US 12,364,031 B2
(45) Date of Patent: Jul. 15, 2025

(54) PHOTOELECTRIC CONVERTER AND IMAGING DEVICE

(71) Applicant: SONY SEMICONDUCTOR SOLUTIONS CORPORATION, Kanagawa (JP)

(72) Inventor: Chigusa Yamane, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 468 days.

(21) Appl. No.: 17/754,282

(22) PCT Filed: Sep. 16, 2020

(86) PCT No.: PCT/JP2020/035040
§ 371 (c)(1),
(2) Date: Mar. 29, 2022

(87) PCT Pub. No.: WO2021/070586
PCT Pub. Date: Apr. 15, 2021

(65) Prior Publication Data
US 2022/0344401 A1 Oct. 27, 2022

(30) Foreign Application Priority Data
Oct. 7, 2019 (JP) .................................. 2019-184425

(51) Int. Cl.
*H10F 39/18* (2025.01)
*H10F 30/225* (2025.01)
*H10F 39/00* (2025.01)

(52) U.S. Cl.
CPC ........... *H10F 39/18* (2025.01); *H10F 30/225* (2025.01); *H10F 39/80* (2025.01)

(58) Field of Classification Search
CPC ......... H01L 27/14643; H01L 27/14601; H01L 31/107; H01L 31/02164; H01L 31/035281; H01L 27/146; H01L 31/1035
See application file for complete search history.

(56) References Cited

U.S. PATENT DOCUMENTS

| | | | | | |
|---|---|---|---|---|---|
| 5,654,578 | A | * | 8/1997 | Watanabe | .............. B82Y 20/00 257/458 |
| 8,558,339 | B1 | * | 10/2013 | Yamaji | .................. H01L 31/107 257/443 |

(Continued)

FOREIGN PATENT DOCUMENTS

| | | |
|---|---|---|
| CA | 2731307 A | 1/2010 |
| CN | 110546766 A | 12/2019 |

(Continued)

OTHER PUBLICATIONS

WO2018212175A1, espacenet machine translation (Year: 2018).*

(Continued)

*Primary Examiner* — Suberr L Chi
*Assistant Examiner* — William C. Trice, III
(74) *Attorney, Agent, or Firm* — CHIP LAW GROUP

(57) ABSTRACT

A first photoelectric converter according to an embodiment of the present disclosure includes: a light absorbing layer having a light incidence surface and including a compound semiconductor material; a first electrode that is provided for each of pixels to be opposed to a surface of the light absorbing layer opposite to the light incidence surface; a first semiconductor layer of a first electrical conduction type; a second semiconductor layer of a second electrical conduction type; a diffusion region of the second electrical conduction type; a groove that separates the first semiconductor layer, the second semiconductor layer, and a portion of the light absorbing layer between the adjacent pixels; a first insulating film that is continuously provided on a side wall and a bottom surface of the groove; and a light shielding film that is continuously provided from a side wall of the first semiconductor layer to a side wall of the light absorbing layer with the first insulating film interposed in between. The first semiconductor layer is provided between the light absorbing layer and the first electrode. The second semiconductor layer is provided between the first semiconductor layer and the light absorbing layer. The diffusion region is provided between the adjacent pixels across the second semiconductor layer and the light absorbing layer.

19 Claims, 18 Drawing Sheets

(56) References Cited

U.S. PATENT DOCUMENTS

| | | |
|---|---|---|
| 2002/0074503 A1 | 6/2002 | Watanabe |
| 2011/0163305 A1 | 7/2011 | Ogusu et al. |
| 2011/0169117 A1* | 7/2011 | McIntosh .......... H01L 31/02162 |
| | | 257/E31.128 |
| 2015/0256769 A1 | 9/2015 | Kim et al. |

FOREIGN PATENT DOCUMENTS

| | | |
|---|---|---|
| EP | 1207559 A2 | 5/2002 |
| EP | 2312649 A1 | 4/2011 |
| JP | H06097490 A | 4/1994 |
| JP | 2002-246582 A | 8/2002 |
| JP | 2010-034166 A | 2/2010 |
| KR | 10-2011-0050402 A | 5/2011 |
| KR | 10-2015-0105861 A | 9/2015 |
| KR | 10-2020-0004291 A | 1/2020 |
| WO | 2010/010932 A1 | 1/2010 |
| WO | WO-2017104045 A1 | 6/2017 |
| WO | WO-2018212175 A1 * | 11/2018 ........... H01L 27/146 |

OTHER PUBLICATIONS

International Search Report and Written Opinion of PCT Application No. PCT/JP2020/035040, issued on Dec. 8, 2020, 09 pages of ISRWO.

* cited by examiner

[FIG. 1]
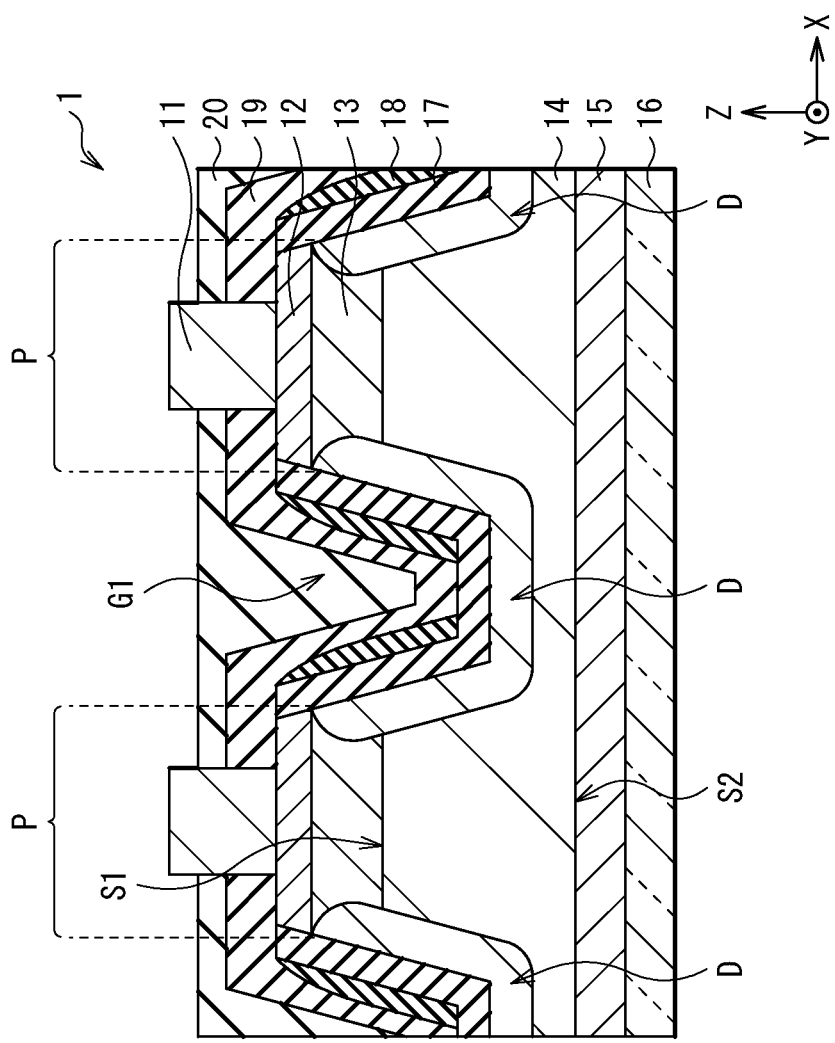

[FIG. 2]
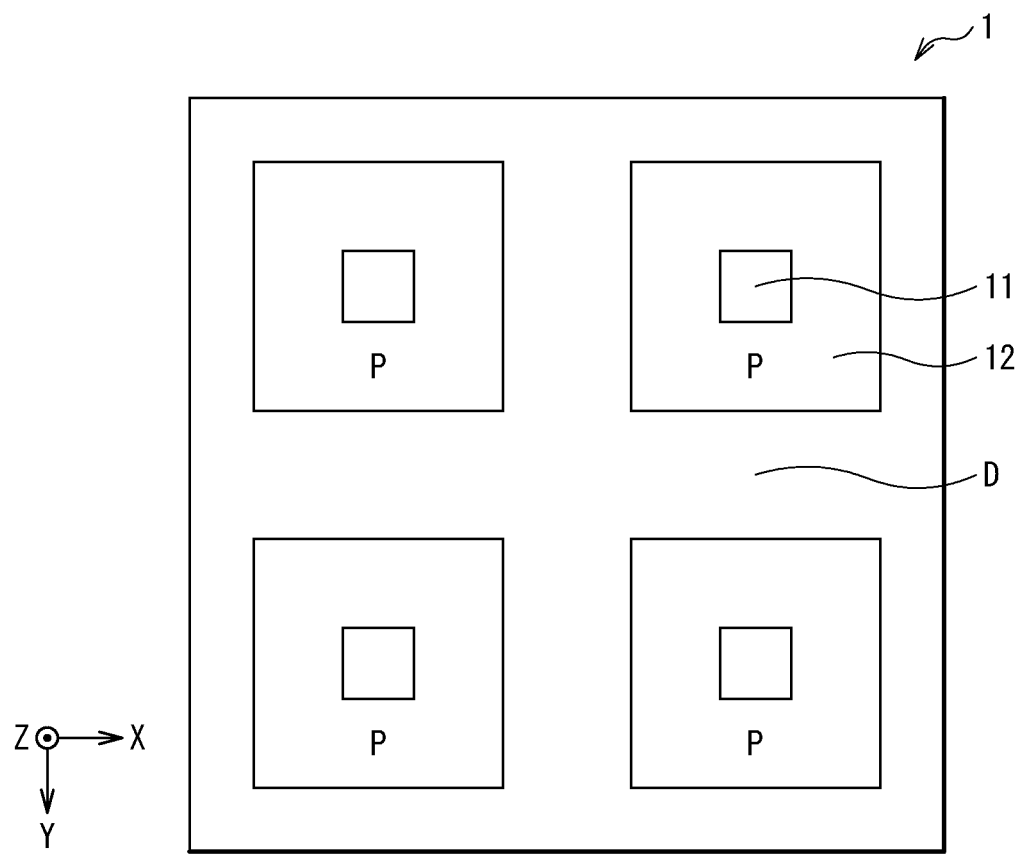

[FIG. 3A]
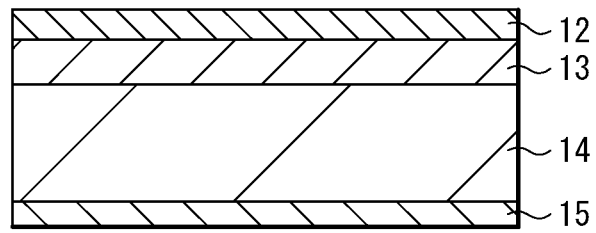
[FIG. 3B]
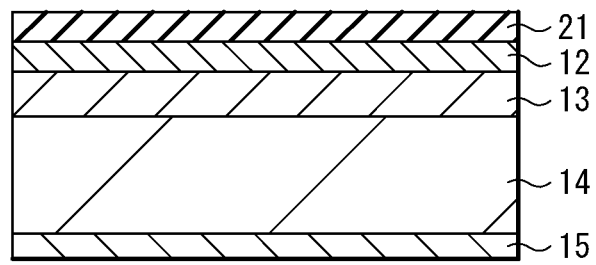
[FIG. 3C]
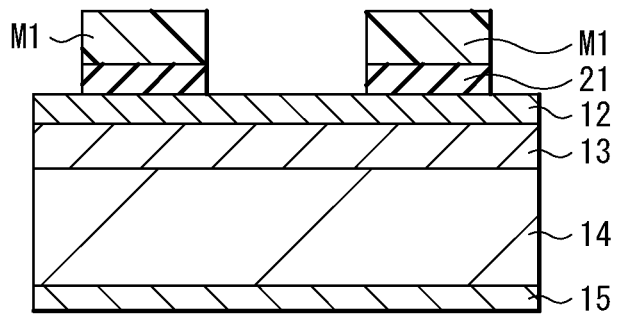
[FIG. 3D]
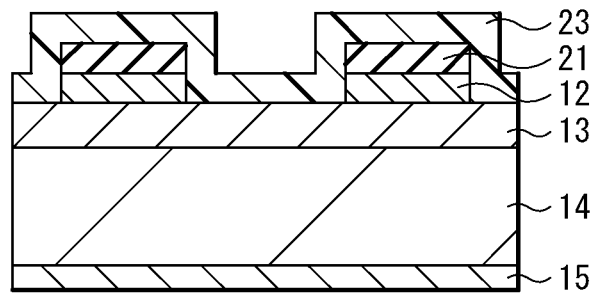

[FIG. 3E]
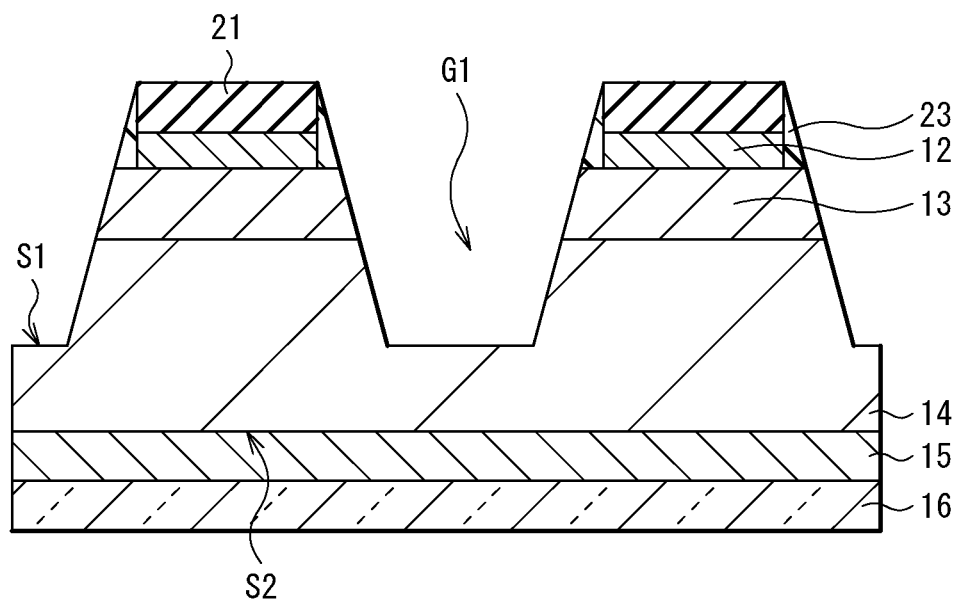
[FIG. 3F]
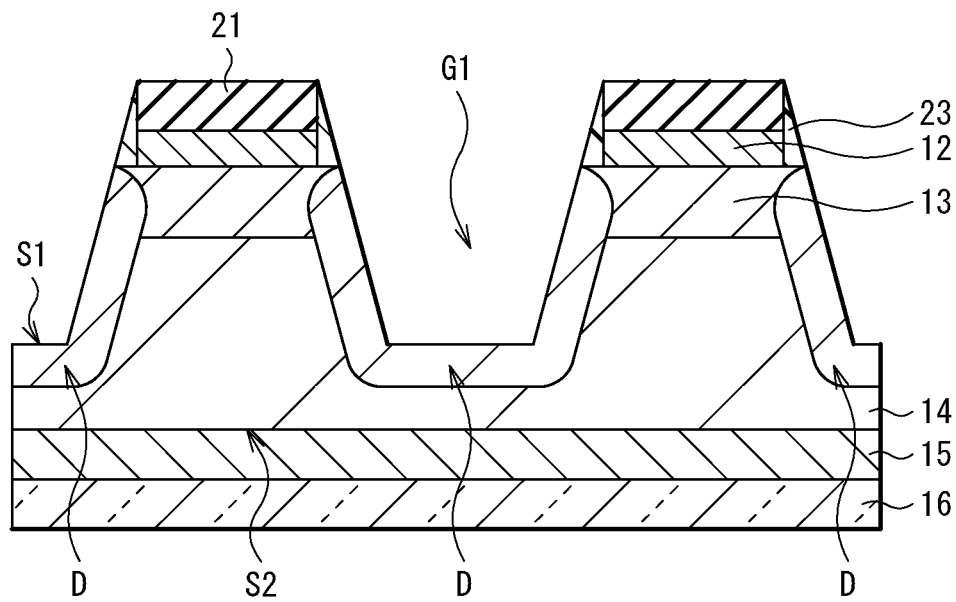

[FIG. 3G]
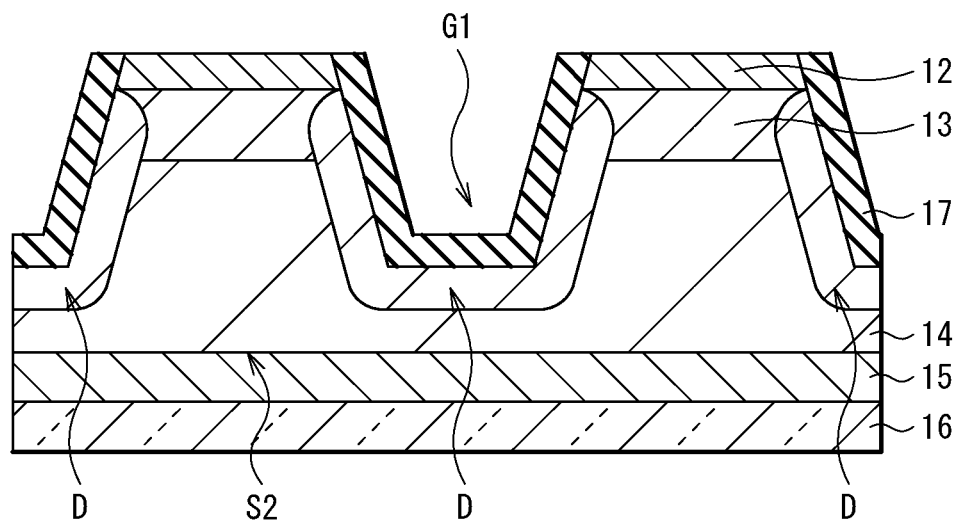
[FIG. 3H]
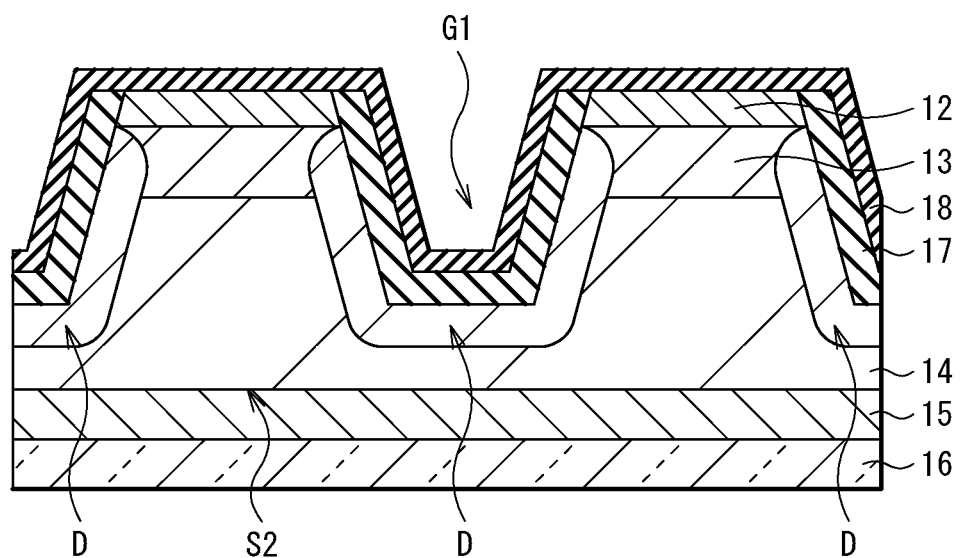

[FIG. 3I]
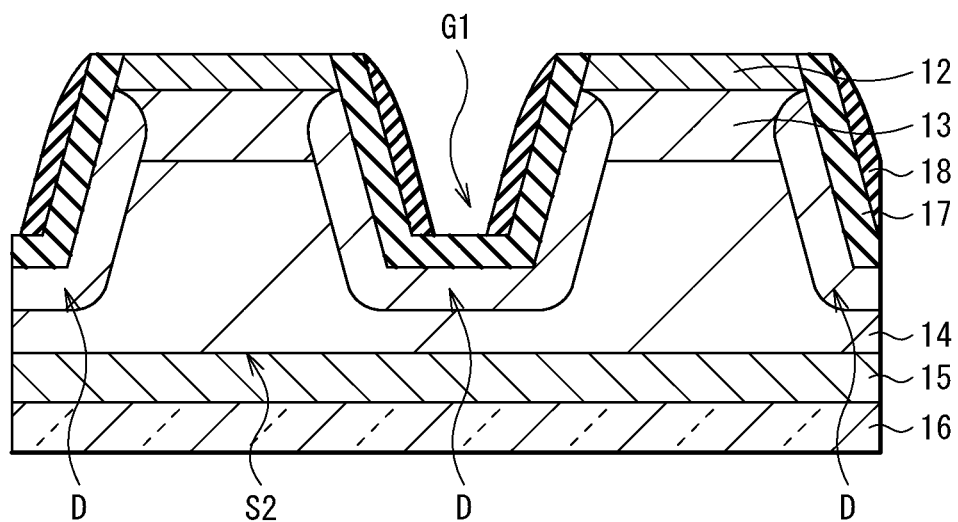
[FIG. 3J]
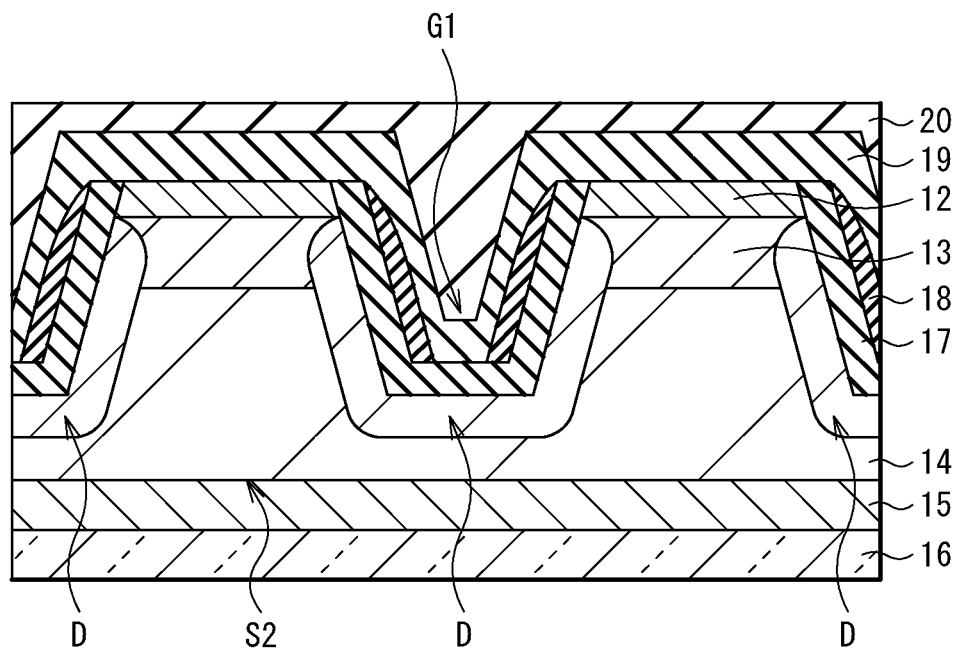

[FIG. 4]
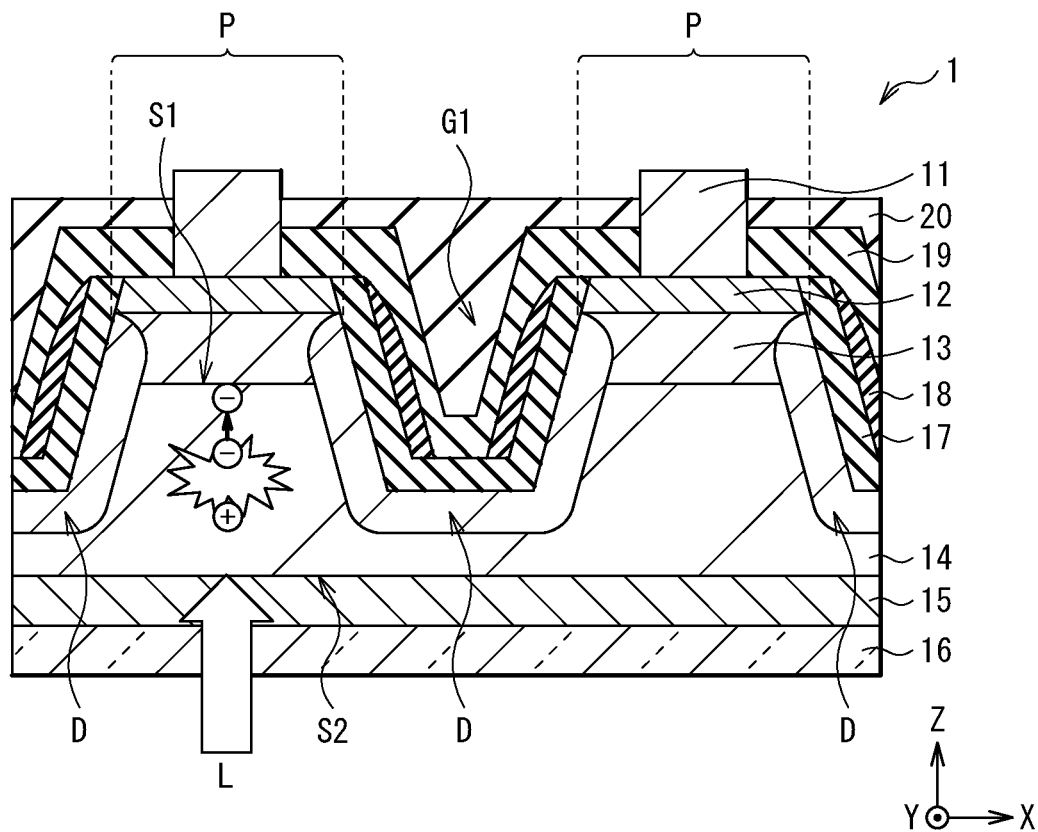
[FIG. 5]
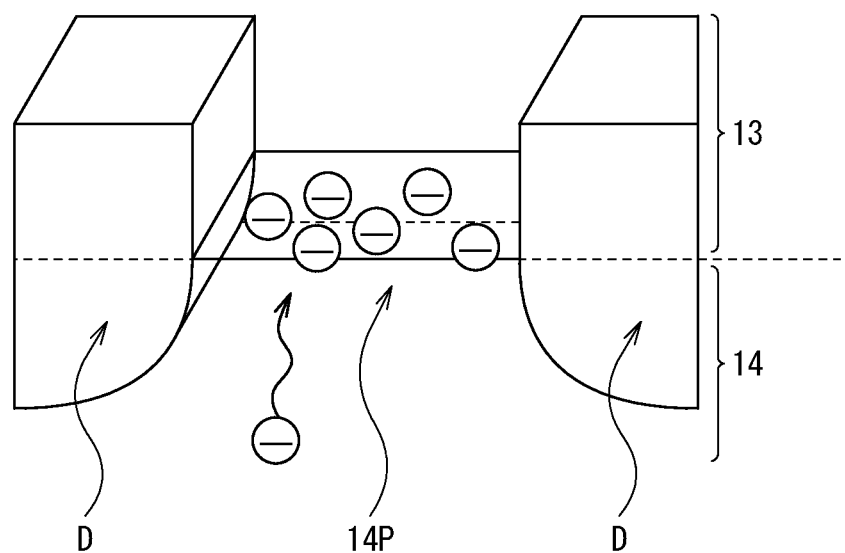

[FIG. 6]
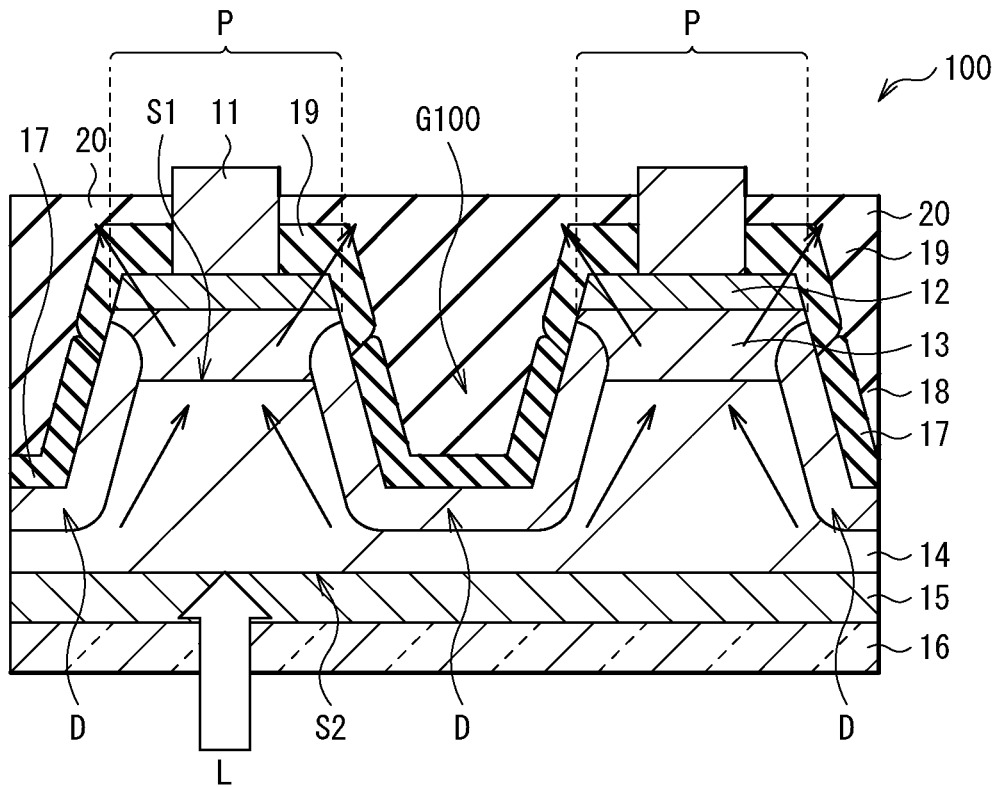
[FIG. 7]
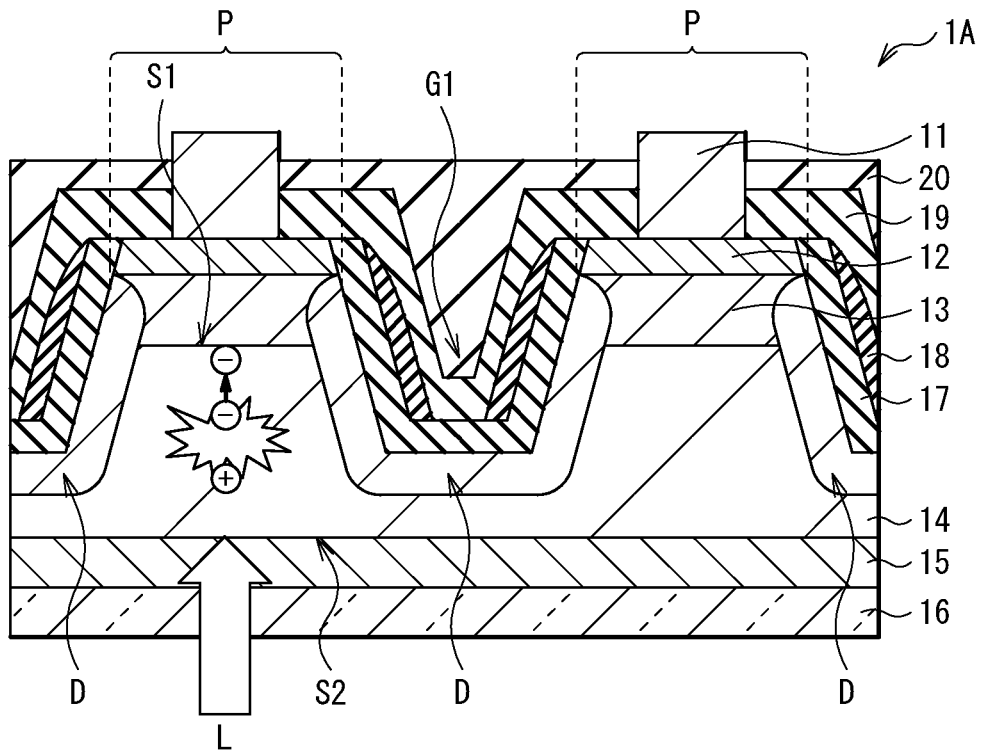

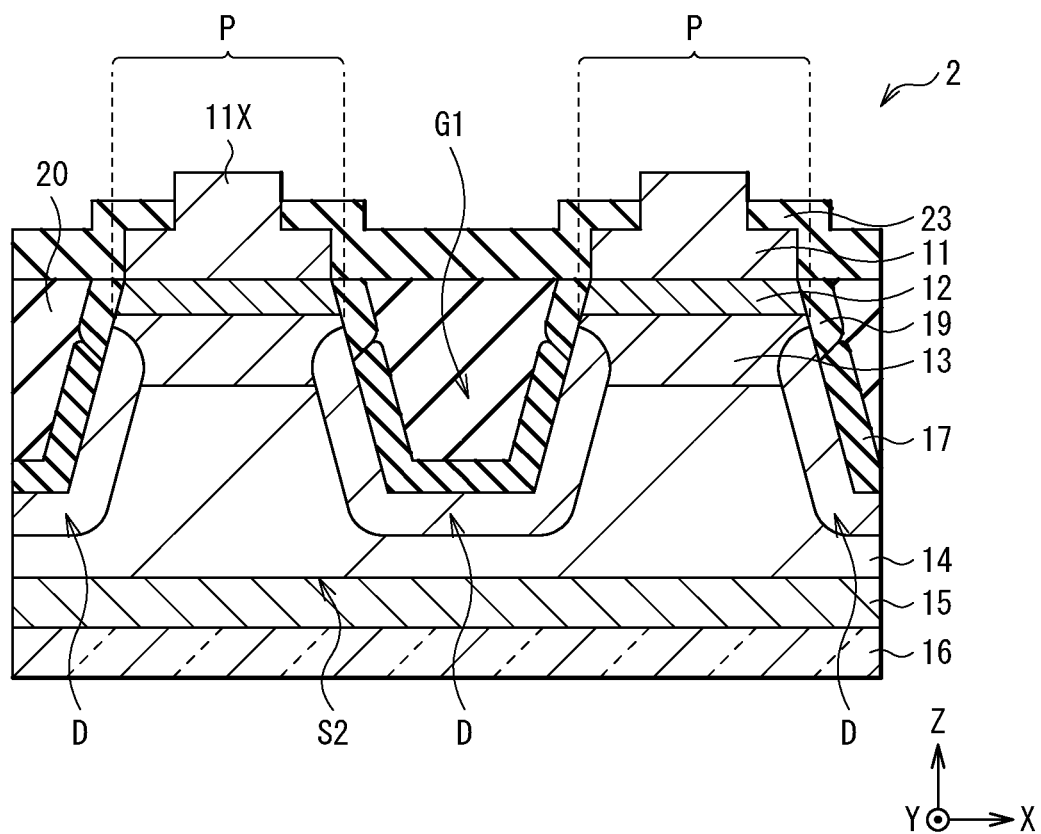
[FIG. 8]

[FIG. 9A]
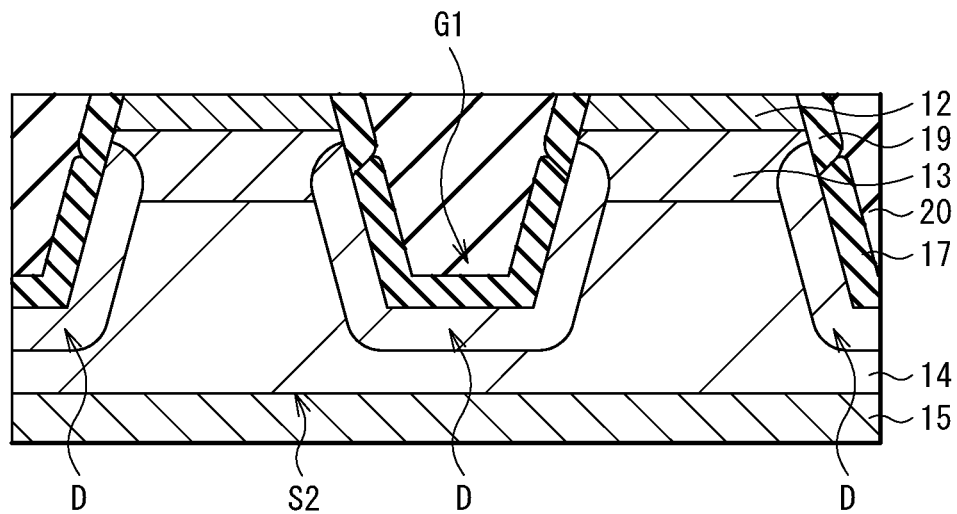
[FIG. 9B]
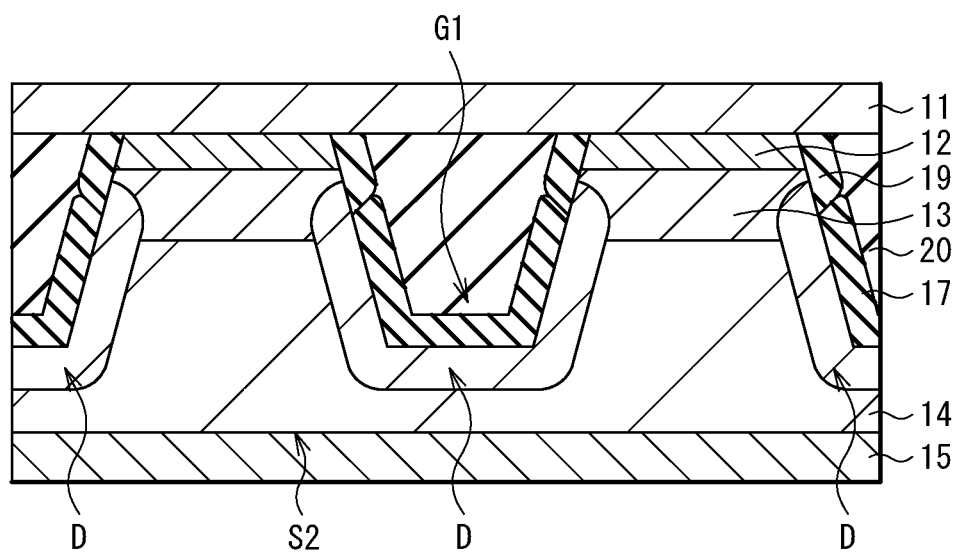

[FIG. 9C]
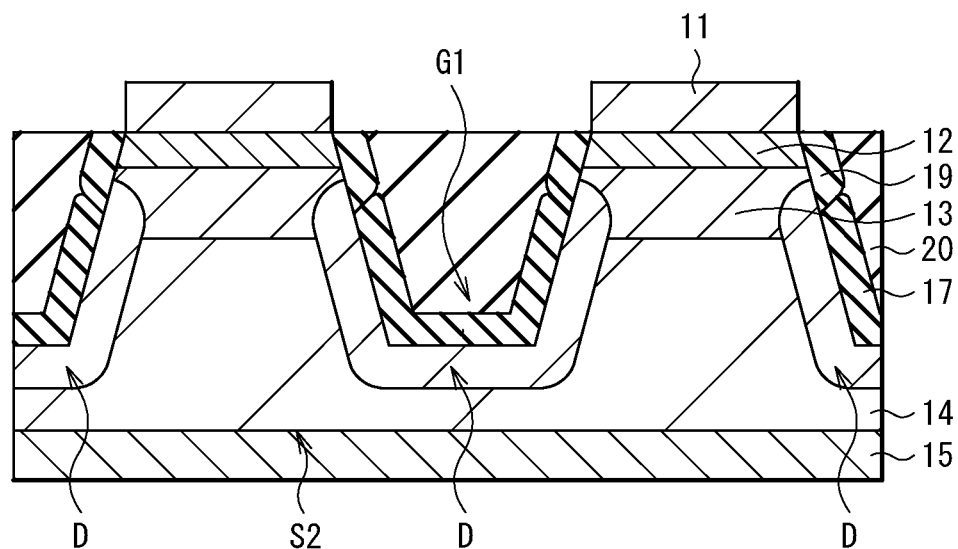
[FIG. 9D]
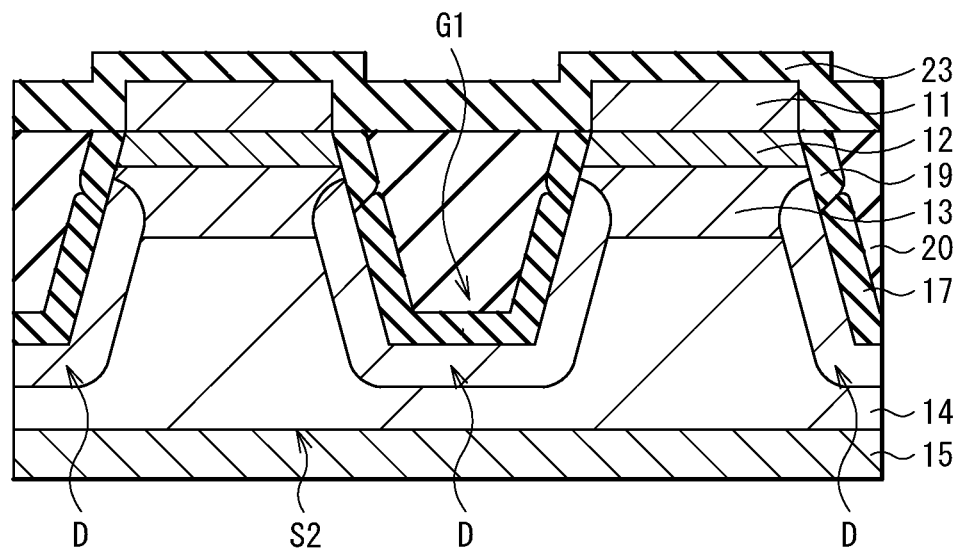

[FIG. 9E]
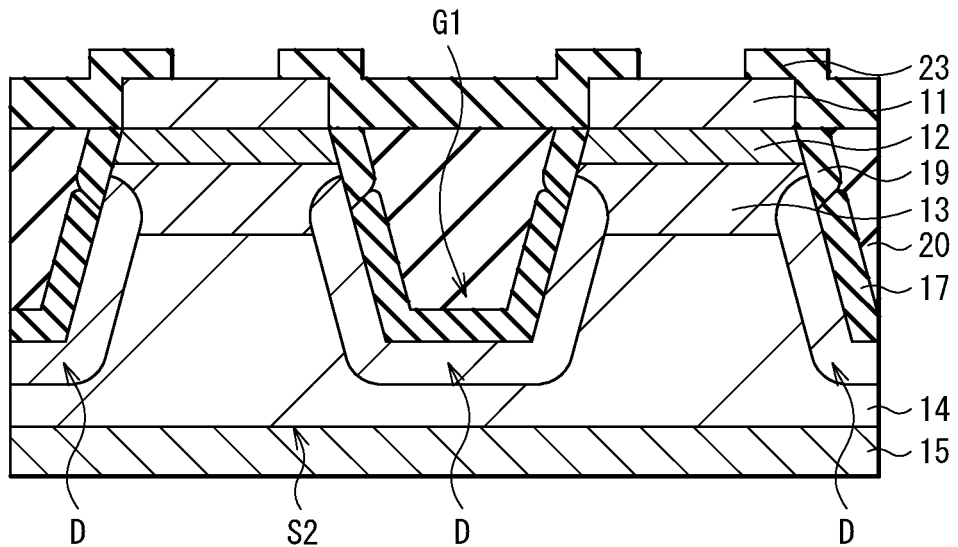
[FIG. 10]
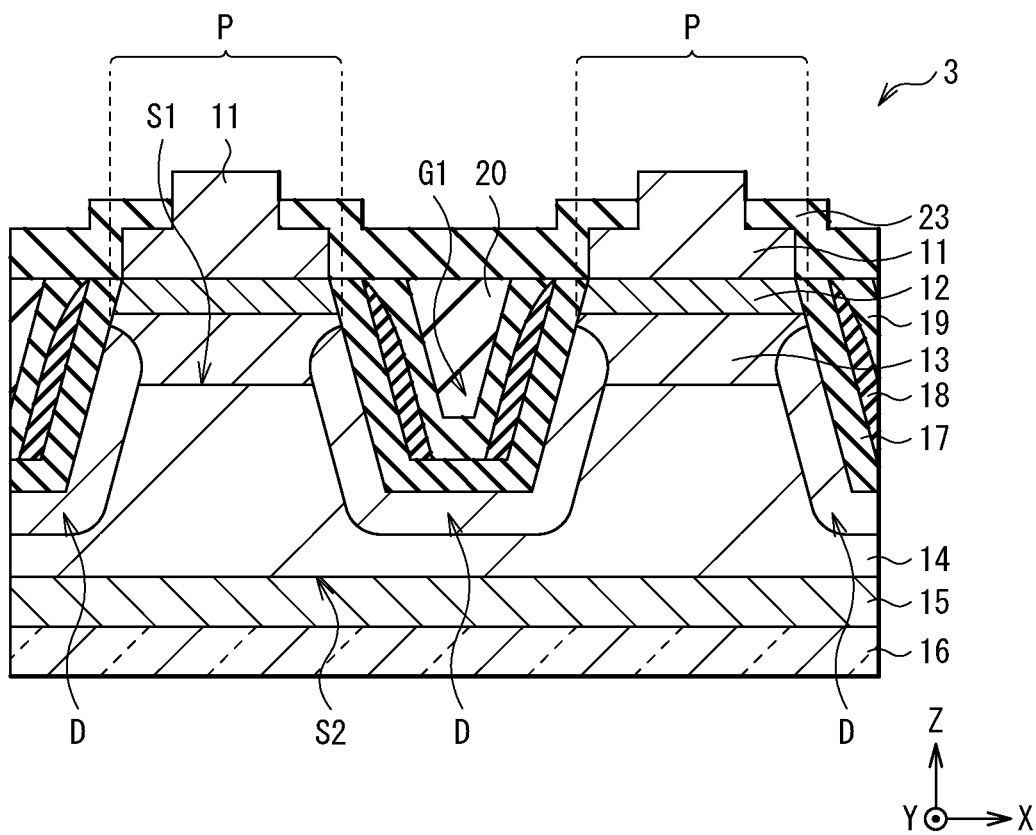

[FIG. 11]
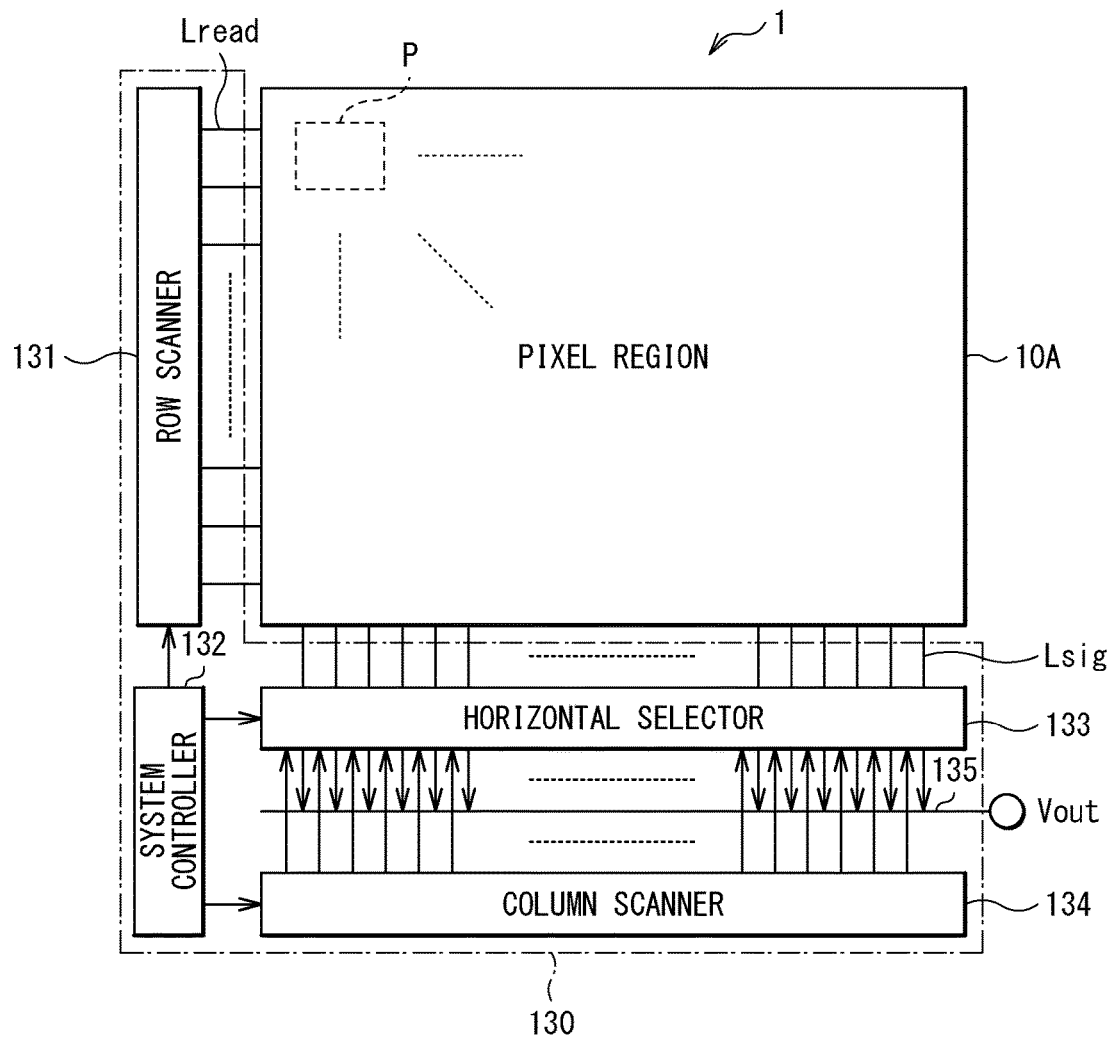
[FIG. 12]
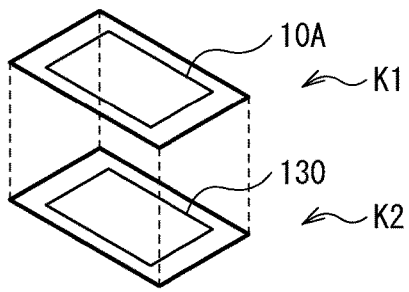

[FIG. 13]
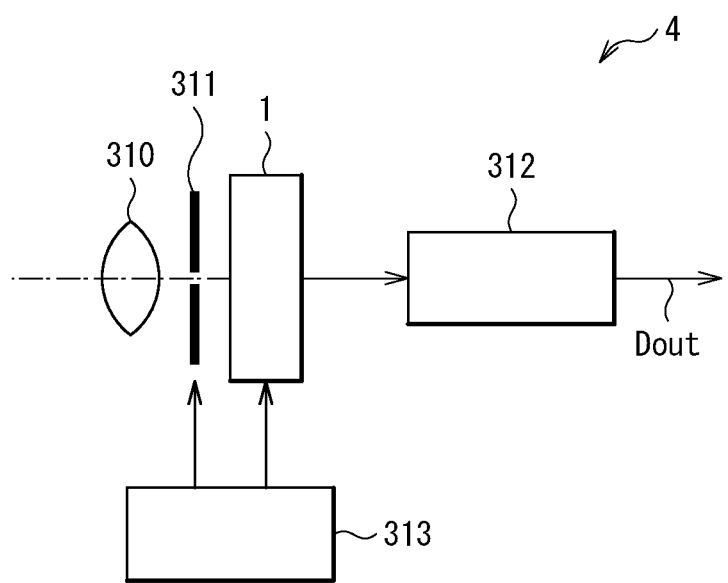

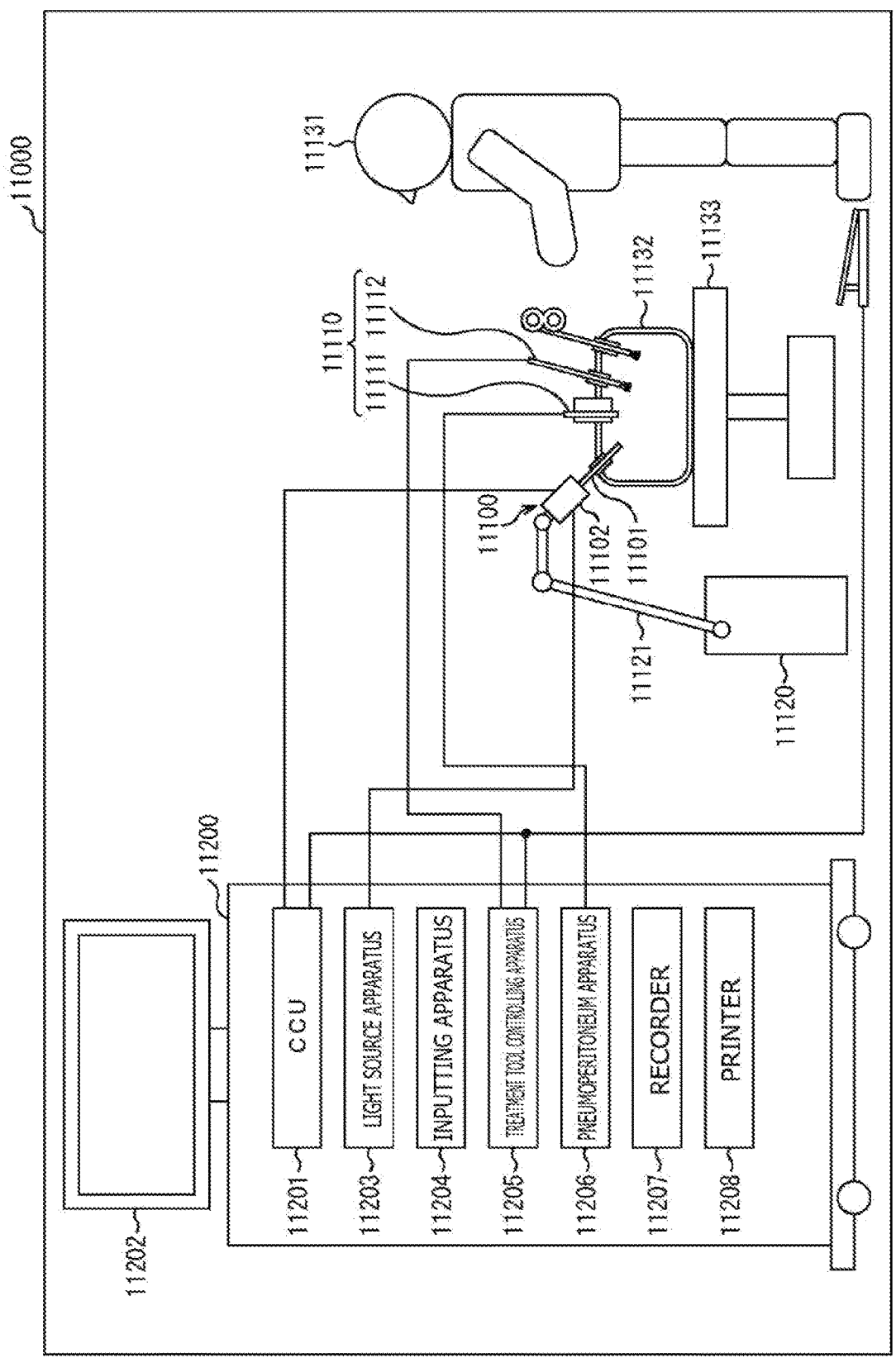
[FIG. 14]

[FIG. 15]
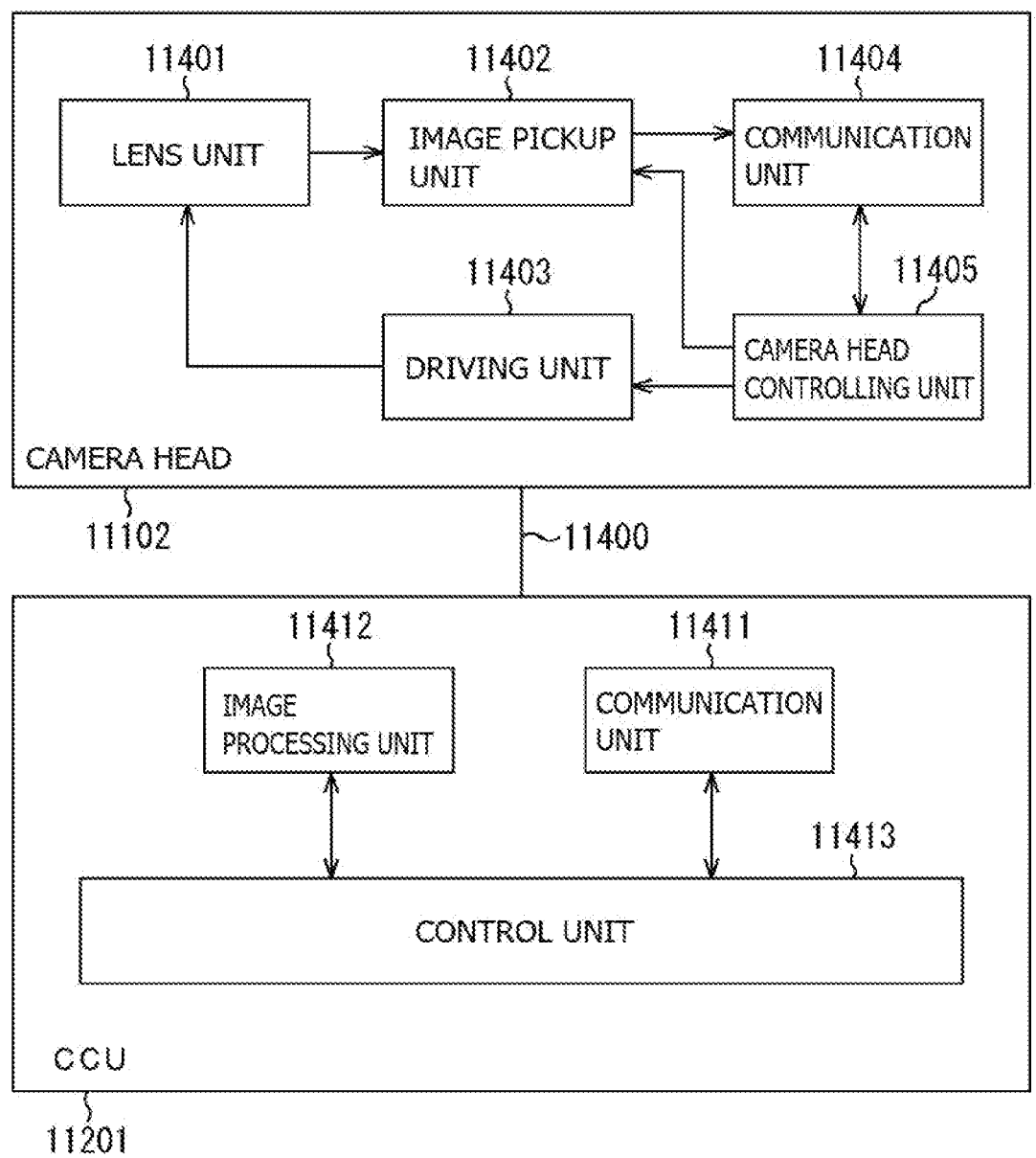

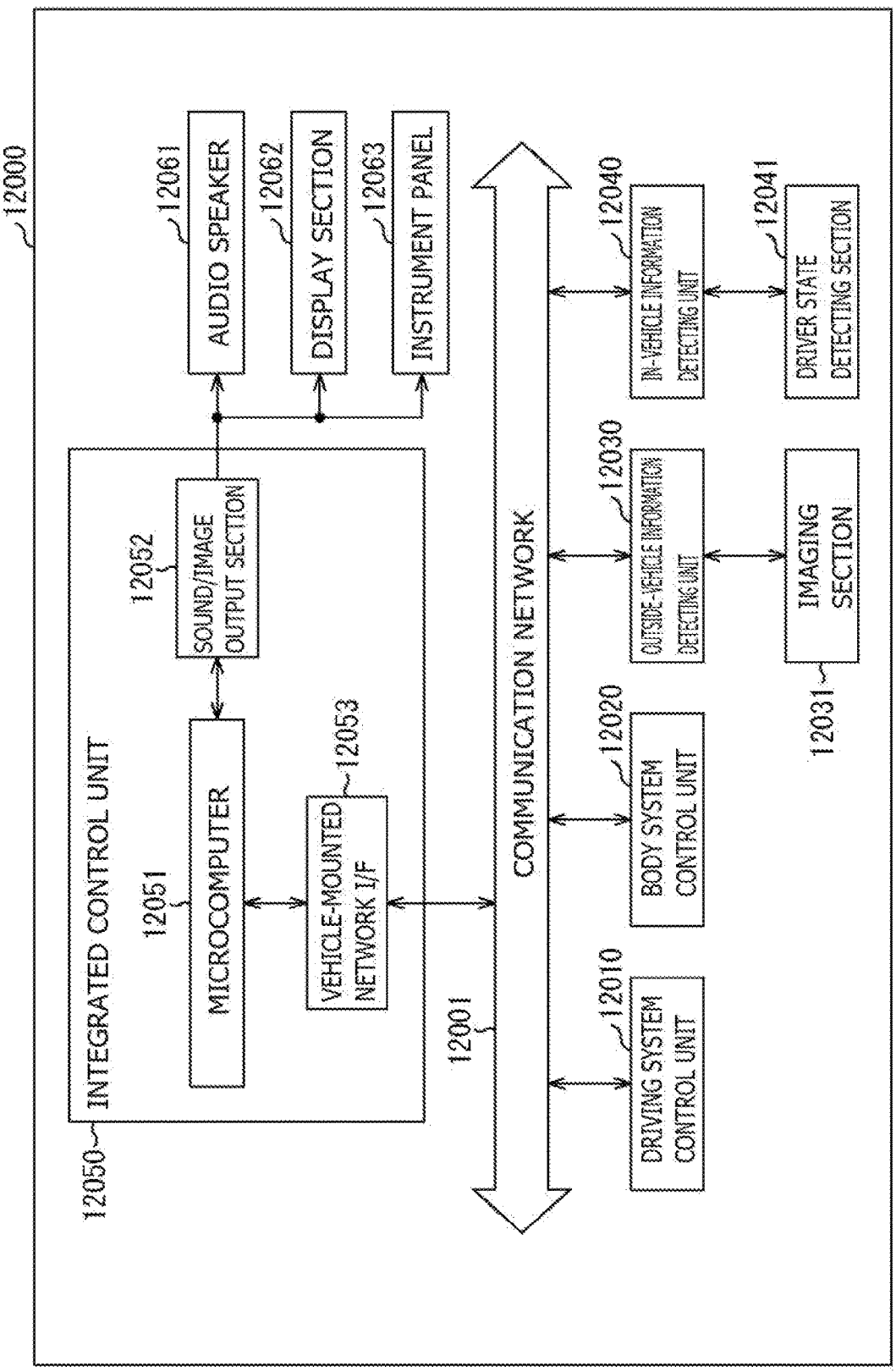
[FIG. 16]

[FIG. 17]
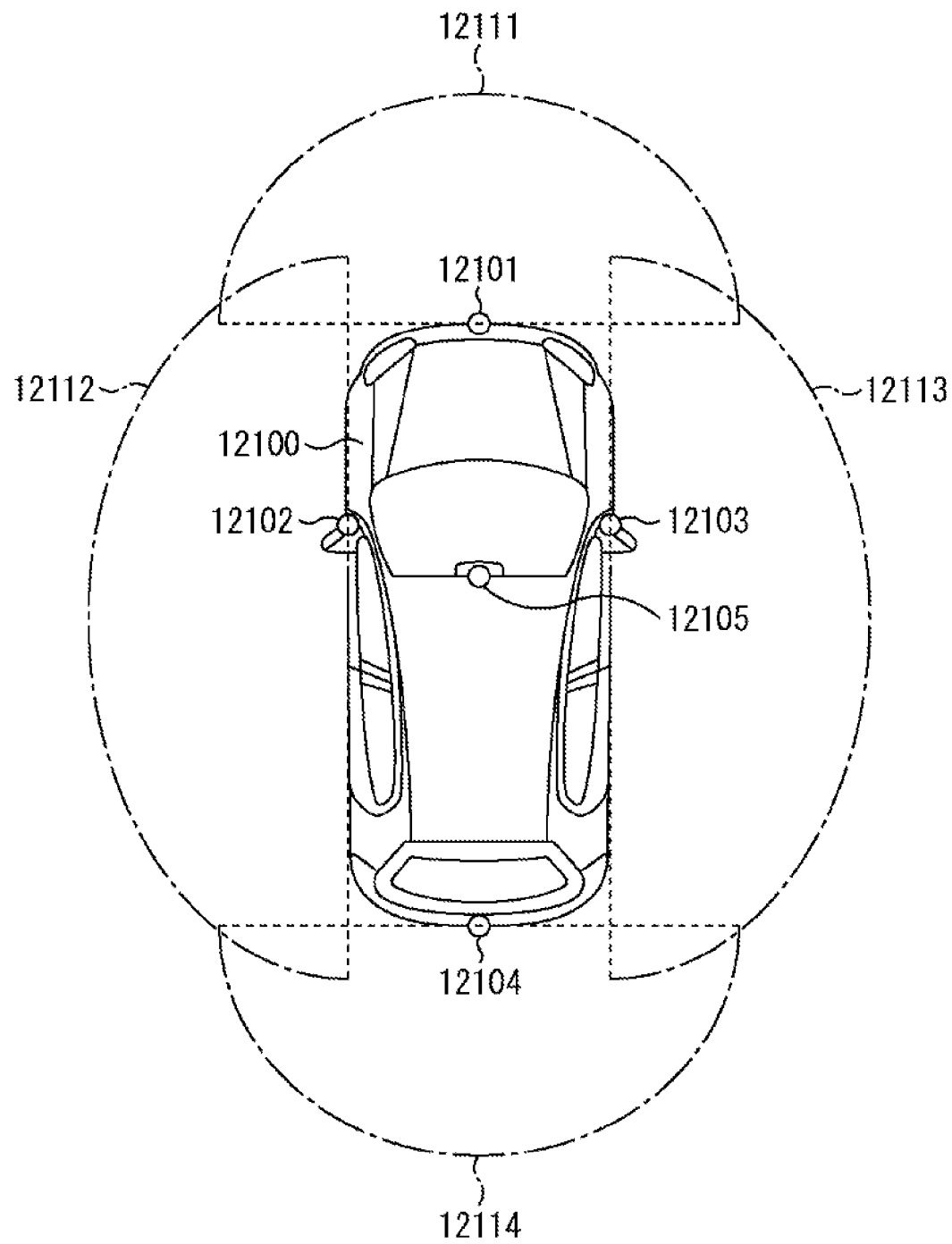

PHOTOELECTRIC CONVERTER AND IMAGING DEVICE

CROSS REFERENCE TO RELATED APPLICATIONS

This application is a U.S. National Phase of International Patent Application No PCT/JP2020/035040 filed on Sep. 16, 2020, which claims priority benefit of Japanese Patent Application No. JP 2019-184425 filed in the Japan Patent Office on Oct. 7, 2019. Each of the above-referenced applications is hereby incorporated herein by reference in its entirety.

TECHNICAL FIELD

The present disclosure relates, for example, to a photoelectric converter and an imaging device that are used for an infrared sensor or the like.

BACKGROUND ART

Image sensors (infrared sensors) each having sensitivity in the infrared region have been commercialized in recent years. For example, PTL 1 discloses an imaging device (photoelectric converter) used for an infrared sensor. In the imaging device (photoelectric converter), a light absorbing layer is used that includes, for example, a III-V group semiconductor such as InGaAs (indium gallium arsenide). This imaging device is provided with a diffusion region that electrically separates adjacent pixels. This suppresses the movement of signal charge between the adjacent pixels.

CITATION LIST

Patent Literature

PTL 1: International Publication No. WO 2018/212175

SUMMARY OF THE INVENTION

Incidentally, infrared sensors are each requested to have higher image quality.

It is desirable to provide a photoelectric converter and an imaging device each of which makes it possible to increase the image quality.

A first photoelectric converter according to an embodiment of the present disclosure includes: a light absorbing layer having a light incidence surface and including a compound semiconductor material; a first electrode that is provided for each of pixels to be opposed to a surface of the light absorbing layer opposite to the light incidence surface; a first semiconductor layer of a first electrical conduction type; a second semiconductor layer of a second electrical conduction type; a diffusion region of the second electrical conduction type; a groove that separates the first semiconductor layer, the second semiconductor layer, and a portion of the light absorbing layer between the adjacent pixels; a first insulating film that is continuously provided on a side wall and a bottom surface of the groove; and a light shielding film that is continuously provided from a side wall of the first semiconductor layer to a side wall of the light absorbing layer with the first insulating film interposed in between. The first semiconductor layer is provided between the light absorbing layer and the first electrode. The second semiconductor layer is provided between the first semiconductor layer and the light absorbing layer. The diffusion region is provided between the adjacent pixels across the second semiconductor layer and the light absorbing layer.

A first imaging device according to an embodiment of the present disclosure includes: a light absorbing layer having a light incidence surface and including a compound semiconductor material; a first electrode that is provided for each of pixels to be opposed to a surface of the light absorbing layer opposite to the light incidence surface; a first semiconductor layer of a first electrical conduction type; a second semiconductor layer of a second electrical conduction type; a diffusion region of the second electrical conduction type; a groove that separates the first semiconductor layer, the second semiconductor layer, and a portion of the light absorbing layer between the adjacent pixels; a first insulating film that is continuously provided on a side wall and a bottom surface of the groove; and a light shielding film that is continuously provided from a side wall of the first semiconductor layer to a side wall of the light absorbing layer with the first insulating film interposed in between. The first semiconductor layer is provided between the light absorbing layer and the first electrode. The second semiconductor layer is provided between the first semiconductor layer and the light absorbing layer. The diffusion region is provided between the adjacent pixels across the second semiconductor layer and the light absorbing layer.

A second photoelectric converter according to an embodiment of the present disclosure includes: a light absorbing layer having a light incidence surface and including a compound semiconductor material; a first semiconductor layer of a first electrical conduction type; a second semiconductor layer of a second electrical conduction type; a diffusion region of the second electrical conduction type; a groove that separates the first semiconductor layer, the second semiconductor layer, and a portion of the light absorbing layer between the adjacent pixels; and a first electrode that is provided for each of the pixels. The second semiconductor layer is provided between the first semiconductor layer and the light absorbing layer. The diffusion region is provided between adjacent pixels across the second semiconductor layer and the light absorbing layer. The first electrode covering a surface of the first semiconductor layer opposite to a surface opposed to the second semiconductor layer and having a light shielding property.

A second imaging device according to an embodiment of the present disclosure includes: a light absorbing layer having a light incidence surface and including a compound semiconductor material; a first semiconductor layer of a first electrical conduction type; a second semiconductor layer of a second electrical conduction type; a diffusion region of the second electrical conduction type; a groove that separates the first semiconductor layer, the second semiconductor layer, and a portion of the light absorbing layer between the adjacent pixels; and a first electrode that is provided for each of the pixels. The second semiconductor layer is provided between the first semiconductor layer and the light absorbing layer. The diffusion region is provided between adjacent pixels across the second semiconductor layer and the light absorbing layer. The first electrode covering a surface of the first semiconductor layer opposite to a surface opposed to the second semiconductor layer and having a light shielding property.

In the first photoelectric converter according to the embodiment of the present disclosure and the first imaging device according to the embodiment, the light shielding film is provided on the side wall of the groove. The groove separates the first semiconductor layer, the second semiconductor layer, and the portion of the light absorbing layer between the adjacent pixels. The light shielding film exclusively belongs to the side wall of the first semiconductor layer to the side wall of the light absorbing layer. In the second photoelectric converter according to the embodiment of the present disclosure and the second imaging device according to the embodiment, the first electrode is provided on the surface of the first semiconductor layer opposite to the light absorbing layer. The first electrode covers the surface of the first semiconductor layer opposite to the light absorbing layer and has the light shielding property. This reduces light leakage between the adjacent pixels.

BRIEF DESCRIPTION OF DRAWING

FIG. 1 is a cross-sectional schematic diagram illustrating an example of a schematic configuration of an imaging device according to a first embodiment of the present disclosure.

FIG. 2 is a schematic diagram illustrating a planar configuration of the imaging device illustrated in FIG. 1.

FIG. 3A is a cross-sectional schematic diagram illustrating a step of a method of manufacturing the imaging device illustrated in FIG. 1.

FIG. 3B is a cross-sectional schematic diagram illustrating a step subsequent to FIG. 3A.

FIG. 3C is a cross-sectional schematic diagram illustrating a step subsequent to FIG. 3B.

FIG. 3D is a cross-sectional schematic diagram illustrating a step subsequent to FIG. 3C.

FIG. 3E is a cross-sectional schematic diagram illustrating a step subsequent to FIG. 3D.

FIG. 3F is a cross-sectional schematic diagram illustrating a step subsequent to FIG. 3E.

FIG. 3G is a cross-sectional schematic diagram illustrating a step subsequent to FIG. 3F.

FIG. 3H is a cross-sectional schematic diagram illustrating a step subsequent to FIG. 3G.

FIG. 3I is a cross-sectional schematic diagram illustrating a step subsequent to FIG. 3H.

FIG. 3J is a cross-sectional schematic diagram illustrating a step subsequent to FIG. 3I.

FIG. 4 is a cross-sectional schematic diagram for describing an operation of the imaging device illustrated in FIG. 1.

FIG. 5 is a cross-sectional schematic diagram for describing a temporary pool section of signal charge illustrated in FIG. 4.

FIG. 6 is a cross-sectional schematic diagram illustrating a schematic configuration of an imaging device according to a comparative example.

FIG. 7 is a cross-sectional schematic diagram illustrating another example of the schematic configuration of the imaging device according to the first embodiment of the present disclosure.

FIG. 8 is a cross-sectional schematic diagram illustrating a schematic configuration of an imaging device according to a second embodiment of the present disclosure.

FIG. 9A is a cross-sectional schematic diagram illustrating a step of a method of manufacturing an imaging device for the imaging device illustrated in FIG. 8.

FIG. 9B is a cross-sectional schematic diagram illustrating a step subsequent to FIG. 9A.

FIG. 9C is a cross-sectional schematic diagram illustrating a step subsequent to FIG. 9B.

FIG. 9D is a cross-sectional schematic diagram illustrating a step subsequent to FIG. 9C.

FIG. 9E is a cross-sectional schematic diagram illustrating a step subsequent to FIG. 9D.

FIG. 10 is a cross-sectional schematic diagram illustrating a schematic configuration of an imaging device according to a modification example of the present disclosure.

FIG. 11 is a block diagram illustrating a configuration of the imaging device.

FIG. 12 is a schematic diagram illustrating a configuration example of a stacked imaging device.

FIG. 13 is a functional block diagram illustrating an example of an electronic apparatus (camera) in which the imaging device illustrated in FIG. 12 is used.

FIG. 14 is a view depicting an example of a schematic configuration of an endoscopic surgery system.

FIG. 15 is a block diagram depicting an example of a functional configuration of a camera head and a camera control unit (CCU).

FIG. 16 is a block diagram depicting an example of schematic configuration of a vehicle control system.

FIG. 17 is a diagram of assistance in explaining an example of installation positions of an outside-vehicle information detecting section and an imaging section.

MODES FOR CARRYING OUT THE INVENTION

The following describes embodiments of the present disclosure in detail with reference to the drawings. It is to be noted that description is given in the following order.
1. First Embodiment (an example of an imaging device including a light shielding film on the side wall of a groove that separates a first semiconductor layer, a second semiconductor layer, and a portion of a light absorbing layer for each of the pixels)
1-1. Configuration of Imaging Device
1-2. Method of Manufacturing Imaging Device
1-3. Operation of Imaging Device
1-4. Workings and Effects
2. Second Embodiment (an example of an imaging device including a first electrode that covers a first semiconductor layer and has a light shielding property)
2-1. Configuration of Imaging Device
2-2. Method of Manufacturing Imaging Device
2-3. Workings and Effects
3. Modification Examples (an example of an imaging device including a light shielding film that covers the side wall of a groove which separates a first semiconductor layer, a second semiconductor layer, and a portion of a light absorbing layer for each of the pixels and a first electrode that covers the first semiconductor layer and has a light shielding property)
4. Application Examples
5. Practical Application Examples

1. FIRST EMBODIMENT

Each of FIGS. 1 and 2 illustrates an example of a schematic configuration of an imaging device (imaging device 1) according to a first embodiment of the present disclosure. FIG. 1 illustrates a cross-sectional configuration of the imaging device 1 and FIG. 2 illustrates a planar configuration of the imaging device 1. The imaging device 1 is applied, for example, to an infrared sensor or the like in which a compound semiconductor material such as a III-V group semiconductor is used. The imaging device 1 has a photoelectric conversion function for light having a wavelength, for example, from the visible region (e.g., 380 nm or more to less than 780 nm) to the short infrared region (e.g., 780 nm or more to less than 2400 nm). This imaging device 1 is provided, for example, with a plurality of light receiving unit regions P (pixels P) that is two-dimensionally disposed in a matrix. Here, description is given by referring to the imaging device 1 as a specific example of a photoelectric converter according to the present technology.

(1-1. Configuration of Imaging Device)

The pixels P of the imaging device 1 are each provided with a first electrode 11, a first semiconductor layer 12, a second semiconductor layer 13, a light absorbing layer 14, a contact layer 15, and a second electrode 16 in this order. The light absorbing layer 14 has a first surface S1 (the surface opposite to the light incidence surface) and a second surface S2 (light incidence surface) that are opposed to each other. The first surface S1 is provided with the second semiconductor layer 13. The second surface S2 is provided with the contact layer 15. In this imaging device 1, light coming from the second electrode 16 side enters the second surface S2 of the light absorbing layer 14 through the contact layer 15. The imaging device 1 includes a diffusion region D from the side wall of the second semiconductor layer 13 to the light absorbing layer 14.

In the present embodiment, the imaging device 1 is provided with a groove G1 between the adjacent pixels P. The groove G1 separates the first semiconductor layer 12, the second semiconductor layer 13, and a portion of the light absorbing layer 14. The side wall and the bottom surface of the groove G1 are provided with an insulating film 17 and the side wall of the groove G1 is further provided with a light shielding film 18 with the insulating film 17 interposed in between. The imaging device 1 is provided with an insulating film 19 from the periphery of the first electrode 11 to the side wall and the bottom surface of the groove G1. The imaging device 1 is further provided with a protective film 20. The protective film 20 covers the insulating film 19 and the groove G1 is filled with the protective film 20 to planarize the region between the adjacent pixels P (specifically, between the adjacent first electrodes 11).

The first electrode 11 is a readout electrode that is supplied with a voltage for reading out the signal charge (holes or electrons, but description is given below on the assumption that the signal charge is electrons for the sake of convenience) generated in the light absorbing layer 14. The first electrode 11 is provided for each of the pixels P to be opposed to the first surface S1 of the light absorbing layer 14. The first electrode 11 is electrically coupled to a pixel circuit and a silicon semiconductor substrate, for example, through a bump, a via, or the like. The pixel circuit is for reading out a signal. The silicon semiconductor substrate is provided, for example, with a variety of wiring lines and the like. This first electrode 11 is provided, for example, in contact with the first semiconductor layer 12. The planar shape of the first electrode 11 is, for example, a rectangular shape. The plurality of the first electrodes 11 is disposed to be spaced apart from each other. An opening of the insulating film 19 is filled with each of the first electrodes 11. The insulating film 19 and the protective film 20 are provided between the adjacent first electrodes 11.

Each of the first electrodes 11 includes, for example, any of titanium (Ti), tungsten (W), titanium nitride (TiN), platinum (Pt), gold (Au), copper (Cu), germanium (Ge), palladium (Pd), zinc (Zn), nickel (Ni), indium (In), and aluminum (Al) alone or alloy including at least one of them. The first electrode 11 may be a single layer film including such a material or may be a stacked film including a combination of two or more of them.

The first semiconductor layer 12 and the second semiconductor layer 13 are separated, for example, by the groove G1 and provided for each of the pixels P. As described below, this first semiconductor layer 12 and this second semiconductor layer 13 are for forming a pn junction and each include a compound semiconductor material that has band gap energy greater than the band gap energy of a compound semiconductor material included in the light absorbing layer 14. In a case where the light absorbing layer 14 includes, for example, InGaAs (indium gallium arsenide having a band gap energy of 0.75 eV), it is possible to use, for example, InP (indium phosphide having a band gap energy of 1.35 eV) for the first semiconductor layer 12 and the second semiconductor layer 13. It is possible to use a III-V group semiconductor including, for example, at least any one of In (indium), Ga (gallium), Al (aluminum), As (arsenic), P (phosphorus), Sb (antimony), or N (nitrogen) for the first semiconductor layer 12 and the second semiconductor layer 13. Specifically, InGaAsP (indium gallium arsenide phosphide), InAsSb (indium arsenide antimonide), InGaP (indium gallium phosphide), GaAsSb (gallium arsenide antimonide), InAlAs (indium aluminum arsenide), and the like are included in addition to InP. The sum of the thickness of the first semiconductor layer 12 and the thickness of the second semiconductor layer 13 is, for example, 100 nm to 3000 nm.

In a case where the total film thickness of the first semiconductor layer 12 and the second semiconductor layer 13 is less than 100 nm, for example, the pn junction formed between the first semiconductor layer 12 and the second semiconductor layer 13 may come into contact, for example, with the first electrode 11 or the light absorbing layer 14. In a case where the total film thickness of the first semiconductor layer 12 and the second semiconductor layer 13 is greater than 3000 nm, it is difficult to extend and form the diffusion region D to the light absorbing layer 14. This makes it difficult to electrically separate the adjacent pixels P.

The first semiconductor layer 12 disposed between the first electrode 11 and the second semiconductor layer 13 has, for example, a carrier of an n type (first electrical conduction type). The second semiconductor layer 13 is disposed between the first semiconductor layer 12 and the light absorbing layer 14 (first surface S1) and has a carrier of the opposite electrical conduction type to that of the first semiconductor layer 12. For example, the second semiconductor layer 13 has a carrier of a p type (second electrical conduction type). This causes a pn junction to be formed between the first semiconductor layer 12 and the second semiconductor layer 13 (the interface between the first semiconductor layer 12 and the second semiconductor layer 13). Although described below in detail, the formation of a pn junction at the interface between the first semiconductor layer 12 and the second semiconductor layer 13 that each have a band gap greater than that of the light absorbing layer 14 makes it possible to reduce dark currents. There may be provided an i-type semiconductor layer (intrinsic semiconductor layer) between the first semiconductor layer 12 and the second semiconductor layer 13 to form a pin junction.

The light absorbing layer 14 between the second semiconductor layer 13 and the contact layer 15 is provided, for example, as a common layer to all of the pixels P. This light absorbing layer 14 absorbs light having a predetermined wavelength and generates signal charge. The light absorbing layer 14 includes, for example, a p-type compound semiconductor material. A compound semiconductor material included in the light absorbing layer 14 is a III-V group semiconductor including, for example, at least any one of In (indium), Ga (gallium), Al (aluminum), As (arsenic), P (phosphorus), Sb (antimony), or N (nitrogen). Specifically, InGaAs (indium gallium arsenide), InGaAsP (indium gallium arsenide phosphide), InAsSb (indium arsenide antimonide), InGaP (indium gallium phosphide), GaAsSb (gallium arsenide antimonide), InAlAs (indium aluminum arsenide), and the like are included. The doping density of the light absorbing layer 14 is, for example, $1 \times 10^{14}$ cm$^{-3}$ to $1 \times 10^{17}$ cm$^{-3}$. In a case where the doping density of the light absorbing layer 14 is greater than $1 \times 10^{17}$ cm$^{-3}$, there is an increase in loss probability because of the recombination of the signal charge generated through photoelectric conversion. This lowers the quantum efficiency.

The thickness of the light absorbing layer 14 is, for example, 100 nm to 10000 nm. In a case where the thickness of the light absorbing layer 14 is less than 100 nm, the light absorbing layer 14 transmits more pieces of light and may considerably reduce the quantum efficiency. In a case where the light absorbing layer 14 has a thickness of greater than 10000 nm, it is difficult to form the diffusion region D having a depth of 5000 nm or more. This makes it difficult to sufficiently suppress the occurrence of crosstalk between the adjacent pixels P. The light absorbing layer 14 photoelectrically converts light having, for example, a wavelength from the visible region to the short infrared region.

The groove G1 is disposed between the adjacent pixels P and provided, for example, to have a lattice shape in a plan view. The groove G1 has, for example, a tapered shape and reaches the inside of the light absorbing layer 14.

The diffusion region D is, for example, a region in which p-type impurities are diffused. The diffusion region D is provided, for example, near the side wall (the side wall of the second semiconductor layer 13) of the groove G1 and the bottom section (the inside of the light absorbing layer 14) of the groove G1. The diffusion region D is provided to have a lattice shape in a plan view (FIG. 2). The diffusion region D is provided across the second semiconductor layer 13 and the light absorbing layer 14. The interface between the second semiconductor layer 13 and the light absorbing layer 14 in each of the pixels P is thus surrounded by the diffusion region D. Although described below in detail, this forms a temporary pool section (a temporary pool section 14P in FIG. 5 described below) of signal charge.

In the diffusion region D, for example, zinc (Zn) is diffused as a p-type impurity. Examples of p-type impurities may include magnesium (Mg), cadmium (Cd), beryllium (Be), silicon (Si), germanium (Ge), carbon (C), tin (Sn), lead (Pb), sulfur (S), tellurium (Te), or the like. The doping density of the diffusion region D is, for example, $1 \times 10^{17}$ cm$^{-3}$ to $5 \times 10^{19}$ cm$^{-3}$. The doping density of the diffusion region D greater than or equal to $1 \times 10^{17}$ cm$^{-3}$ suppresses the occurrence of dark currents at the interface. $5 \times 10^{19}$ cm$^{-3}$, which is the upper limit of the doping density, is an upper limit offered by a diffusion process. Doping density greater than $5 \times 10^{19}$ cm$^{-3}$ is close to a solubility limit. Dopants aggregate inside crystal to form a defect and the dark current characteristics are deteriorated.

The contact layer 15 is provided, for example, as a common layer to all of the pixels P. This contact layer 15 is provided between the light absorbing layer 14 (second surface S2) and the second electrode 16 and is in contact with them. The contact layer 15 is a region to which the electric charge discharged from the second electrode 16 moves. The contact layer 15 includes, for example, a compound semiconductor including p-type impurities. It is possible to use, for example, p-type InP (indium phosphide) for the contact layer 15.

The second electrode 16 is provided on the whole of the second surface S2 (light incidence surface) of the light absorbing layer 14 with the contact layer 15 interposed in between, for example, as a common electrode to the respective pixels P. The second electrode 16 is for discharging electric charge that is not used as signal charge out of the electric charge generated in the light absorbing layer 14. For example, in a case where electrons are read out from the first electrode 11 as signal charge, it is possible to discharge, for example, holes through this second electrode 16. The second electrode 16 includes a transparent electrically conducive film that is able to transmit incident light such as infrared light. The second electrode 16 has a transmittance of 50% or more with respect to light having, for example, a wavelength of 1.6 μm (1600 nm). It is possible to use, for example, ITO (Indium Tin Oxide) or ITiO ($In_2O_3$—$TiO_2$) for the second electrode 16.

The insulating film 17 continuously is provided from the side wall to the bottom surface of the groove G1. Specifically, the insulating film 17 covers the side walls of the first semiconductor layer 12, the second semiconductor layer 13, and the light absorbing layer 14 and the first surface S1 of the light absorbing layer 14 in the groove G1. This insulating film 17 is for protecting the side walls of the first semiconductor layer 12, the second semiconductor layer 13, and the light absorbing layer 14 and the first surface S1 of the light absorbing layer in the groove G1 that are exposed by the groove G1.

The insulating film 17 includes, for example, an insulating material or a semiconductor material. Examples of the insulating material included in the insulating film 17 include an insulating material including at least one of silicon (Si), nitrogen (N), aluminum (Al), hafnium (Hf), tantalum (Ta), titanium (Ti), magnesium (Mg), scandium (Sc), zirconium (Zr), oxygen (O), lanthanum (La), gadolinium (Gd), or yttrium (Y). Specifically, the insulating film 17 includes, for example, an aluminum oxide ($Al_2O_3$) film. The insulating film 17 may include a silicon nitride (SiN) film, a silicon oxide ($SiO_2$) film, a silicon oxynitride (SiON) film, an aluminum oxynitride (AlON) film, a silicon aluminum nitride (SiAlN) film, magnesium oxide (MgO), a silicon aluminum oxide (AlSiO) film, a hafnium oxide ($HfO_2$) film, a hafnium aluminum oxide (HfAlO) film, a tantalum oxide ($Ta_2O_3$) film, a titanium oxide ($TiO_2$) film, a scandium oxide ($Sc_2O_3$) film, a zirconium oxide ($ZrO_2$) film, a gadolinium oxide ($Gd_2O_3$) film, a lanthanum oxide ($La_2O_3$) film, an yttrium oxide ($Y_2O_3$) film, or the like. Examples of the semiconductor material included in the insulating film 17 include a IV group semiconductor material such as silicon (Si) and germanium (Ge). The thickness of the insulating film 17 is, for example, 1 nm to 500 nm. There is no specific lower limit on the thickness of the insulating film 17, but 1 nm or more is preferable from the viewpoint of a film formation process to completely cover the exposed compound semiconductor. There is no specific upper limit on the thickness of the insulating film 17, but 500 nm or less is preferable from the viewpoint of the subsequent formation of the first electrode 11 and the subsequent planarization process.

The light shielding film 18 is continuously provided to the side wall of the groove G1 with the insulating film 17 interposed in between. In other words, the light shielding film 18 is continuously provided to the whole side walls of the first semiconductor layer 12, the second semiconductor layer 13, and the light absorbing layer 14 with the insulating film 17 interposed in between. Although described below in detail, this light shielding film 18 is for reducing light leakage from the side walls of the first semiconductor layer 12 and the second semiconductor layer 13 to the region between the pixels P in a case of light irradiation. The light shielding film 18 includes, for example, a metal material having a light shielding property. The metal material included in the light shielding film 18 includes tungsten (W), aluminum (Al), ruthenium (Ru), indium (In), cobalt (Co), platinum (Pt), and the like. In addition, examples of the metal material included in the light shielding film 18 include aluminum alloy including copper (Cu), titanium (Ti), or tantalum (Ta). It is possible to form the light shielding film 18 as a single layer film or a stacked film including at least the one or more types of metal materials described above. The thickness of the light shielding film 18 is adjusted as appropriate from the viewpoint of the transmittance of a film including a material used and a process of manufacturing the film.

The insulating film 19 is continuously provided from the upper surface of the first semiconductor layer 12 to the side wall and the bottom surface of the groove G1 with the light shielding film 18 interposed in between. The thickness of the insulating film 19 is smaller than, for example, the thickness of the first electrode 11 and the first electrode 11 protrudes from the insulating film 19. Specifically, it is preferable that the thickness of the insulating film 19 be 10 nm to 5000 nm. The use of the insulating film 19 greater than or equal to 10 nm secures the coverage. In a case where the insulating film 19 has a thickness greater than 5000 nm, it may be difficult to etch the insulating film 19 in forming the first electrode 11.

It is possible to use an insulating material including, for example, at least one of silicon (Si), nitrogen (N), aluminum (Al), hafnium (Hf), tantalum (Ta), titanium (Ti), magnesium (Mg), oxygen (O), lanthanum (La), gadolinium (Gd), or yttrium (Y) for the insulating film 19. Specifically, it is possible to use, for example, a silicon nitride (SiN) film for the insulating film 19. A silicon oxide ($SiO_2$) film, a silicon oxynitride (SiON) film, an aluminum oxynitride (AlON) film, a silicon aluminum nitride (SiAlN) film, magnesium oxide (MgO), an aluminum oxide ($Al_2O_3$) film, a silicon aluminum oxide (AlSiO) film, a hafnium oxide ($HfO_2$) film, a hafnium aluminum oxide (HfAlO) film, or the like may be used for the insulating film 19. The insulating film 19 may include an organic material.

The protective film 20 covers the insulating film 19 and the groove G1 is filled with the protective film 20. In addition, the protective film 20 is for planarizing the region between the adjacent pixels P (specifically, between the adjacent first electrodes 11). It is possible to use an insulating material including, for example, at least one of silicon (Si), nitrogen (N), aluminum (Al), hafnium (Hf), tantalum (Ta), titanium (Ti), magnesium (Mg), oxygen (O), lanthanum (La), gadolinium (Gd), or yttrium (Y) for the protective film 20. Specifically, the protective film 20 includes, for example, a silicon oxide ($SiO_2$) film. The protective film 20 may include a silicon nitride (SiN) film, an aluminum oxide ($Al_2O_3$) film, a silicon oxynitride (SiON) film, an aluminum oxynitride (AlON) film, a silicon aluminum nitride (SiAlN) film, magnesium oxide (MgO), a silicon aluminum oxide (AlSiO) film, a hafnium oxide ($HfO_2$) film, a hafnium aluminum oxide (HfAlO) film, or the like.

Although the respective layers included in the imaging device 1 illustrated in FIG. 1 have been described above, the imaging device 1 may include another layer.

For example, there may be provided an electric charge collection layer between the second semiconductor layer 13 and the light absorbing layer 14. The electric charge collection layer is for temporarily accumulating the signal charge generated in the light absorbing layer 14. The electric charge collection layer has, for example, the same material and the same polarity as those of the light absorbing layer 14 and has a lower impurity concentration than that of the light absorbing layer 14. For example, in a case where p-type InGaAs (indium gallium arsenide) is used for the light absorbing layer 14, it is possible to use p-type InGaAs having a lower p-type impurity concentration than that of the light absorbing layer for the electric charge collection layer. In a case where the signal charge is electrons, a material having lower conduction band edge energy than that of a material included in the light absorbing layer 14 may be used for the electric charge collection layer. In a case where the signal charge is holes, a material having higher valence band edge energy than that of a material included in the light absorbing layer 14 may be used for the electric charge collection layer. The electric charge collection layer includes a compound semiconductor material including, for example, at least any one of In (indium), Ga (gallium), Al (aluminum), As (arsenic), P (phosphorus), Sb (antimony), or N (nitrogen).

For example, there may be provided a barrier alleviation layer between the second semiconductor layer 13 and the light absorbing layer 14. The barrier alleviation layer is for alleviating the band offset barrier between the light absorbing layer 14 and the second semiconductor layer 13. In a case where the signal charge is electrons, it is possible to use a compound semiconductor material whose conduction band edge energy is between that of a material included the light absorbing layer 14 and that of a material included in the second semiconductor layer 13 for the barrier alleviation layer. For example, in a case where the light absorbing layer 14 is p-type InGaAs (indium gallium arsenide) and the second semiconductor layer 13 is p-type InP, it is possible to use p-type InGaAsP (indium gallium arsenide phosphide) for the barrier alleviation layer. In a case where the signal charge is holes, it is possible to use a compound semiconductor material whose valence band edge energy is between that of a material included the light absorbing layer 14 and that of a material included in the second semiconductor layer 13 for the barrier alleviation layer. The barrier alleviation layer includes a compound semiconductor material including, for example, at least any one of In (indium), Ga (gallium), Al (aluminum), As (arsenic), P (phosphorus), Sb (antimony), or N (nitrogen).

For example, there may be provided an electric field descending layer between the second semiconductor layer 13 and the light absorbing layer 14. The electric field descending layer is for preventing an electric field applied to a second semiconductor layer 13C from propagating to the light absorbing layer 14. It is possible to use, for example, the same compound semiconductor material as a material included in the second semiconductor layer 13C for this electric field descending layer. For example, in a case where the second semiconductor layer 13C includes p-type InP, it is possible to use p-type InP having a lower p-type impurity concentration than that of the second semiconductor layer 13C for the electric field descending layer. A compound semiconductor material having a band gap that is smaller than the band gap of a material included in the second semiconductor layer 13C and is larger than the band gap of a material included in the light absorbing layer 14 may be used for the electric field descending layer. The electric field descending layer includes a compound semiconductor material including, for example, at least any one of In (indium), Ga (gallium), Al (aluminum), As (arsenic), P (phosphorus), Sb (antimony), or N (nitrogen). This subjects the signal charge generated in the light absorption layer 14 to avalanche amplification and makes it possible to increase the sensitivity characteristics of the imaging device 1.

(1-2. Method of Manufacturing Imaging Device)

It is possible to manufacture the imaging device 1, for example, as follows. FIGS. 3A, 3B, 3C, 3D, 3E, 3F, 3G, 3H, 3I and 3J illustrate examples of steps of manufacturing the imaging device 1 in the order of steps.

First, as illustrated in FIG. 3A, a stacked structure is formed, for example, by epitaxial growth. The stacked structure includes the contact layer 15, the light absorbing layer 14, the second semiconductor layer 13, and the first semiconductor layer 12 in this order. In this case, a pn junction is formed between the second semiconductor layer 13 and the first semiconductor layer 12.

Next, as illustrated in FIG. 3B, an insulating film 21 (e.g., silicon nitride (SiN) film) having, for example, a thickness of 10 nm or more is formed on the whole of the surface of the first semiconductor layer 12. Subsequently, as illustrated in FIG. 3C, photoresist and etching are performed by using, for example, a mask Ml. Dry etching or wet etching is used as the etching. This removes a portion of the insulating film 21 and exposes the surface of the first semiconductor layer 12 in a lattice shape.

Next, as illustrated in FIG. 3D, the insulating film 21 formed in a selective region is used as a mask to etch the first semiconductor layer 12 and expose the second semiconductor layer 13. After that, a protective film 23 is formed that covers the upper surfaces and the side surfaces of the first semiconductor layer 12 and the second semiconductor layer 13. Subsequently, as illustrated in FIG. 3E, the protective film 23, the first semiconductor layer 12, the second semiconductor layer 13, and the light absorbing layer 14 are etched to form the groove G1 that reaches the inside of the light absorbing layer 14. In this case, the insulating film 21 is used as a mask to etch the first semiconductor layer 12, the second semiconductor layer 13, and the light absorbing layer above which the insulating film 21 is not formed. For example, dry etching or wet etching is used as the etching. The groove G1 may be formed by using both dry etching and wet etching.

After the groove G1 is formed, the diffusion region D is formed as illustrated in FIG. 3F. The diffusion region D is formed, for example, by diffusing p-type impurities such as zinc (Zn) from the groove G1. Impurities are diffused, for example, by vapor phase diffusion or solid phase diffusion.

Subsequently, as illustrated in FIG. 3G, the insulating film 17 is formed from the upper surface of the first semiconductor layer 12 to the whole side wall and bottom surface of the groove G1. After that, the insulating film 17 provided on the upper surface of the first semiconductor layer 12 is etched back to expose the surface of the first semiconductor layer 12. The insulating film 17 is formed by forming a film of an insulating material by using, for example, a thermal oxidation method, a CVD (Chemical Vapor Deposition) method, an ALD (Atomic Layer Deposition) method, or the like. The insulating film 17 may be formed by forming a film of a semiconductor material by using, for example, a sputter evaporation method, an electron beam (E-beam gun) evaporation method, a resistance heating evaporation method, a CVD method, an ALD method, or the like. It is possible to use, for example, dry etching or wet etching or both dry etching and wet etching to etch back the insulating film 17 provided on the upper surface of the first semiconductor layer 12.

Next, as illustrated in FIG. 3H, for example, a tungsten (W) film is formed from the upper surface of the first semiconductor layer 12 to the whole side wall and bottom surface of the groove G1 as the light shielding film 18. The light shielding film 18 is formed by forming a film of a metal material by using, for example, a sputter evaporation method, an electron beam (E-beam gun) evaporation method, a resistance heating evaporation method, a CVD method, an ALD method, or the like.

After the light shielding film 18 is formed, the light shielding film 18 on the surface of the first semiconductor layer 12 and the bottom surface of the groove G1 is etched back by photoresist and etching by using, for example, a mask as illustrated in FIG. 3I. Dry etching or wet etching or both dry etching and wet etching are used as the etching. Subsequently, as illustrated in FIG. 3J, for example, a silicon nitride (SiN) film is formed from the surface of the first semiconductor layer 12 to the whole side wall and bottom surface of the groove G1 as the insulating film 19. After that, for example, a silicon oxide ($SiO_2$) film is formed as the protective film 20 to planarize the surface. The insulating film 19 and the protective film 20 are each formed by forming a film of an insulating material by using, for example, a thermal oxidation method, a CVD method, an ALD method, or the like. The insulating film 19 and the protective film 20 may be each formed by forming a film of a semiconductor material by using, for example, a sputter evaporation method, an electron beam (E-beam gun) evaporation method, a resistance heating evaporation method, a CVD method, an ALD method, or the like.

After the protective film 20 is formed, photoresist and etching are performed by using, for example, a mask to form an opening in the protective film 20 and the insulating film 19. The opening reaches the first semiconductor layer 12. This opening is for forming the first electrode 11. The opening is formed at a position that does not overlap with the diffusion region D in a plan view.

After the opening is formed in the protective film 20 and an insulating film 10, the first electrode 11 is formed in this opening. Finally, the second electrode 16 is formed on the whole of the surface of the contact layer 15. This completes the imaging device 1 illustrated in FIG. 1.

(1-3. Operation of Imaging Device)

As illustrated in FIG. 4, in a case where light L (e.g., pieces of light having wavelengths in the visible region and the infrared region) enters the light absorbing layer 14 through the second electrode 16 and the contact layer 15 in the imaging device 1, this light L is absorbed by the light absorbing layer 14. This generates pairs of holes (holes) and electrons in the light absorbing layer 14. In other words, photoelectric conversion is performed. In this case, the application of a predetermined voltage to, for example, the first electrode 11 causes the light absorbing layer 14 to have a potential gradient. This causes one (e.g., electrons) of the two kinds of generated electric charge to move, as signal charge, to the temporary pool section (the temporary pool section 14P in FIG. 5 described below) near the interface between the light absorbing layer 14 and the second semiconductor layer 13.

The temporary pool section 14P formed in the imaging device 1 is described with reference to FIG. 5. The band gap energy of the second semiconductor layer 13 is greater than that of the light absorbing layer 14 and the interface between the light absorbing layer 14 and the second semiconductor layer 13 is thus provided with a band offset barrier. Therefore, the movement of signal charge from the light absorbing layer 14 to the second semiconductor layer 13 is temporarily hindered. In addition, the groove G1 and the diffusion region D are provided between the adjacent pixels P and the movement between the adjacent pixels P is also thus hindered. This causes the signal charge to be temporarily pooled in a pocket-shaped portion that is located near the interface between the light absorbing layer 14 and the second semiconductor layer 13 and surrounded by the diffusion region D (temporary pool section 14P). The signal charge gets over the band offset barrier from this temporary pool section 14P and is collected in the first electrode 11 through the second semiconductor layer 13 and the first semiconductor layer 12. This signal charge is read out by ROIC for each of the pixels P.

(1-4. Workings and Effects)

The imaging device 1 according to the present embodiment is provided with the groove G1 between the adjacent pixels P. The groove G1 separates the first semiconductor layer 12, the second semiconductor layer 13, and a portion of the light absorbing layer 14. The side wall of the groove G1 is provided with the light shielding film 18 with the insulating film 17 interposed in between. This makes it possible to reduce light leakage from the side walls of the first semiconductor layer 12 and the second semiconductor layer 13 to the region between pixels in light irradiation. The following describes this.

As described above, an imaging device provided with a diffusion region between adjacent pixels to suppress the movement of signal charge between the adjacent pixels is developed for an image sensor having sensitivity in the infrared region. Further, as illustrated in FIG. 6, an imaging device 100 is developed that is provided with a groove G100 between the adjacent pixels P. In this imaging device 100, the first semiconductor layer 12 and the second semiconductor layer 13 each including InP and the light absorbing layer 14 including InGaAs are stacked in this order. The insulating film 19 including, for example, silicon nitride (SiN) film extends to a portion of the side wall of the second semiconductor layer 13 around the first electrode 11 provided on the first semiconductor layer 12. The side walls of the remainder of the first semiconductor layer 12 and the light absorbing layer 14 and the bottom surface of the groove G100 are covered with the insulating film 17 including, for example, aluminum oxide ($Al_2O_3$). This makes it possible to suppress the movement of signal charge between the adjacent pixels P.

As illustrated in FIG. 6, the imaging device 100 may have, however, light leakage from the side walls of the first semiconductor layer 12 and the second semiconductor layer 13 covered with the insulating film 19 to the region between the adjacent pixels P in light irradiation. In general, light is not refracted, but travels straight in a case of a small refractive index difference. Each of the layers included in the imaging device 100 has the following refractive index. The InP included in the first semiconductor layer 12 and the second semiconductor layer 13 has a refractive index of 3.2, the InGaAs included in the light absorbing layer 14 has a refractive index of 4, the aluminum oxide ($Al_2O_3$) included in the insulating film 17 has a refractive index of 1.75, and the silicon nitride (SiN) included in the insulating film 19 has a refractive index of 2. In other words, while the light absorbing layer 14 and the insulating film 17 have a refractive index difference of 2.25, the first semiconductor layer 12 and the second semiconductor layer 13 and the insulating film 19 have a small refractive index difference of 1.2. The light L coming from the light incidence surface (second surface S2) therefore leaks from the first semiconductor layer 12 and the second semiconductor layer 13 to the region between the pixels P adjacent with the insulating film 19 interposed in between. The light leaking to the region between the pixels P causes a mixture of colors.

In contrast, in the present embodiment, the light shielding film 18 is provided to the side wall of the groove G1 with the insulating film 17 interposed in between. The groove G1 separates the first semiconductor layer 12, the second semiconductor layer 13, and a portion of the light absorbing layer 14. This makes it possible to reduce light leakage from the side walls of the first semiconductor layer 12 and the second semiconductor layer 13 to the region between the adjacent pixels P. This makes it possible to increase the image quality.

In addition, in the present embodiment, the groove G1 that separates the first semiconductor layer 12, the second semiconductor layer 13, and a portion of the light absorbing layer 14 is provided between the adjacent pixels P. This makes it possible to form the diffusion region D to a position close to the second surface S2 of the light absorbing layer. This makes it possible to suppress the movement of signal charge between the adjacent pixels P more effectively.

Further, the first semiconductor layer 12 and the second semiconductor layer 13 each have band gap energy greater than the band gap energy of the light absorbing layer 14 in the present embodiment. This forms a depletion layer K near the region between the first semiconductor layer 12 and the second semiconductor layer 13 and makes it possible to reduce dark currents. It is thus possible to suppress the movement of signal charge between the adjacent pixels P and reduce dark currents.

It is to be noted that the example has been described in which electrons are read out as signal charge in the present embodiment, but holes may be read out as signal charge. FIG. 7 illustrates another example of a schematic cross-sectional configuration of an imaging device (imaging device 1A) according to the present embodiment. In this imaging device 1A, the holes generated in the light absorbing layer 14 are read out as signal charge. The imaging device 1A has a configuration and effects similar to those of the imaging device 1 except for this point.

In the imaging device 1A, for example, the first semiconductor layer 12 includes p-type InP, the second semiconductor layer 13 includes n-type InP, the light absorbing layer 14 includes n-type InGaAs, and the contact layer 15 includes n-type InP. In the diffusion region D, n-type impurities such as germanium (Ge) are diffused. In a case where the light L enters the light absorbing layer 14 through the second electrode 16 and the contact layer 15 in the imaging device 1A like this, the holes generated in the light absorbing layer 14 are read out to the first electrode 11 as signal charge.

The following describes a second embodiment and modification examples. The following description denotes the same components as those of the first embodiment described above with the same symbols and omits the descriptions thereof as appropriate.

2. SECOND EMBODIMENT

FIG. 8 schematically illustrates a cross-sectional configuration of an imaging device (imaging device 2) according to the second embodiment of the present disclosure. This imaging device 2 is applied, for example, to an infrared sensor or the like in which a compound semiconductor material such as a III-V group semiconductor is used. The imaging device 2 has a photoelectric conversion function for light having a wavelength, for example, from the visible region (e.g., 380 nm or more to less than 780 nm) to the short infrared region (e.g., 780 nm or more to less than 2400 nm). The imaging device 2 is provided, for example, with the plurality of light receiving unit regions P (pixels P) that is two-dimensionally disposed in a matrix. The present embodiment is different from the first embodiment described above in that the first electrode 11 is provided on the surface of the first semiconductor layer 12 opposite to the surface opposed to the second semiconductor layer 13. The first electrode 11 covers the whole of the upper surface of the first semiconductor layer 12 and has a light shielding property.

(2-1. Configuration of Imaging Device)

The pixels P of the imaging device 2 are each provided with the first electrode 11, the first semiconductor layer 12, the second semiconductor layer 13, the light absorbing layer 14, the contact layer 15, and the second electrode 16 in this order as with the imaging device 1 according to the first embodiment described above. The light absorbing layer 14 has the first surface S1 (the surface opposite to the light incidence surface) and the second surface S2 (light incidence surface) that are opposed to each other. The first surface S1 is provided with the second semiconductor layer 13. The second surface S2 is provided with the contact layer 15. In this imaging device 2, light coming from the second electrode 16 side enters the second surface S2 of the light absorbing layer 14 through the contact layer 15. The imaging device 1 includes the diffusion region D from the side wall of the second semiconductor layer 13 to the light absorbing layer 14.

The imaging device 2 according to the present embodiment is provided with the first electrode 11 on the upper surface of the first semiconductor layer 12. The first electrode 11 has substantially the same planar shape as that of the first semiconductor layer 12 in a plan view. The first electrode 11 is further provided with a projecting section 11X. This first electrode 11 includes, for example, tungsten (W), aluminum (Al), ruthenium (Ru), indium (In), cobalt (Co), and aluminum alloy as with the light shielding film 18 according to the first embodiment described above. This imaging device 1 is provided with the groove G1 between the adjacent pixels P as with the imaging device 1 according to the first embodiment described above. The groove G1 separates the first semiconductor layer 12, the second semiconductor layer 13, and a portion of the light absorbing layer 14. The side wall and the bottom surface of the groove G1 are provided with the insulating film 19 from the side wall of the first semiconductor layer 12 to a portion of the side wall of the second semiconductor layer 13. The insulating film 17 is provided over the side walls of the second semiconductor layer 13 and the light absorbing layer 14 and the bottom surface of the groove G1. Further, the groove G1 is filled with the protective film 20. The protective film 20 forms a plane flush with the first semiconductor layer 12 between the adjacent pixels P along with the insulating film 19. The protective film 23 is provided from the periphery of the projecting section 11X of the first electrode 11 to the region between the adjacent pixels P.

(2-2. Method of Manufacturing Imaging Device)

It is possible to manufacture the imaging device 2 like this, for example, as follows.

First, the stacked structure of the contact layer 15, the light absorbing layer 14, the second semiconductor layer 13, and the first semiconductor layer 12 is formed in a manner similar to the description of the first embodiment described above to form the insulating film 21 (FIG. 3B) and selectively remove the insulating film 21 (FIG. 3C). Next, the insulating film 21 is used as a mask to etch the first semiconductor layer 12, the second semiconductor layer 13, and the light absorbing layer 14 and form the groove G1 that reaches the inside of the light absorbing layer 14 (FIG. 3E).

After that, the insulating film 19 is formed that extends from the surface of the first semiconductor layer 12 to a portion of the side wall of the second semiconductor layer 13 and then the diffusion region D is formed. The diffusion region D is provided from the side wall of the second semiconductor layer 13 to the light absorbing layer 14. After the insulating film 17 is formed from the side walls of the second semiconductor layer 13 and the light absorbing layer 14 provided with this diffusion region D to the bottom surface of the groove G1, the groove G1 is filled with the protective film 20 to planarize the surfaces of the insulating film 17 and the protective film 20 as illustrated in FIG. 9A and expose the first semiconductor layer 12.

Next, as illustrated in FIG. 9B, a tungsten (W) film serving as the first electrode 11 is formed on the whole surfaces of the first semiconductor layer 12, the insulating film 17, and the protective film 20. The first electrode 11 is formed by forming a film of a metal material by using, for example, a sputter evaporation method, an electron beam (E-beam gun) evaporation method, a resistance heating evaporation method, a CVD method, an ALD method, or the like. Subsequently, the first electrode 11 on the insulating film 17 and the protective film 20 is etched back by photoresist and etching by using, for example, a mask as illustrated in FIG. 9C to form the first electrode 11 that covers the upper surface of the first semiconductor layer 12. It is possible to perform etching back by using dry etching or wet etching or both dry etching and wet etching.

Next, as illustrated in FIG. 9D, for example, a silicon nitride (SiN) film is formed as the protective film 23 that covers the whole surfaces of the first electrode 11, the insulating film 17, and the protective film 20. The protective film 23 is formed by forming a film of an insulating material by using, for example, a thermal oxidation method, a CVD method, an ALD method, or the like. The protective film 23 may be formed by forming a film of a semiconductor material by using, for example, a sputter evaporation method, an electron beam (E-beam gun) evaporation method, a resistance heating evaporation method, a CVD method, an ALD method, or the like. Subsequently, as illustrated in FIG. 9E, photoresist and etching are performed by using, for example, a mask to form an opening H in the protective film 23. The opening H reaches the first electrode 11.

After the opening H is formed, the projecting section 11X of the first electrode 11 is formed in this opening H. Finally, the second electrode 16 is formed on the whole of the surface of the contact layer 15. This completes the imaging device 2 illustrated in FIG. 8.

(2-3. Workings and Effects)

In the imaging device 2 according to the present embodiment, the whole of the surface of the first semiconductor layer 12 is covered with the first electrode 11 including a metal material having a light shielding property. This makes it possible to reduce light leakage from the upper surface of the first semiconductor layer 12 to the region between the adjacent pixels P. This makes it possible to increase the image quality.

In addition, the adjacent pixels P are also electrically separated by the diffusion region D in the imaging device 2 according to the present embodiment as with the imaging device 1 described above. This makes it possible to suppress the movement of signal charge between the adjacent pixels P. In addition, the depletion layer K is formed near the region between semiconductor layers (between the first semiconductor layer 12 and the second semiconductor layer 13) each having band gap energy greater than the band gap energy of the light absorbing layer 14. This makes it possible to reduce dark currents. Further, the groove G1 is formed in the first semiconductor layer 12 and the second semiconductor layer 13. This makes it possible to form the diffusion region D to a position close to the second surface S2 of the light absorbing layer 14. This makes it possible to suppress the movement of signal charge between the adjacent pixels P more effectively.

It is to be noted that there may be provided an electric charge collection layer, a barrier alleviation layer, and an electric field descending layer between the second semiconductor layer 13 and the light absorbing layer 14 of the imaging device 2 as with the imaging device 1.

3. MODIFICATION EXAMPLES

FIG. 10 illustrates a schematic cross-sectional configuration of an imaging device (imaging device 3) according to a modification example. This imaging device 3 is a combination of the first embodiment and the second embodiment described above. The light shielding film 18 is formed on the side wall of the groove G1. The first electrode 11 is formed on the upper surface of the first semiconductor layer 12. The first electrode 11 has substantially the same planar shape as that of the first semiconductor layer 12 and has a light shielding property. The imaging device 3 has a configuration similar to that of each of the imaging devices 1 and 2 except for this point. This makes it possible to reduce light leakage from the upper surface and the side wall of the first semiconductor layer 12 and the side wall of the second semiconductor layer 13 to the region between the adjacent pixels P more effectively. This makes it possible to further increase the image quality.

4. APPLICATION EXAMPLES

Application Example 1

FIG. 11 illustrates a functional configuration of the imaging device 1 (or any one of the imaging devices 2 and 3 that are collectively referred to as imaging device 1) described in the embodiments described above. The imaging device 1 is, for example, an infrared image sensor. The imaging device 1 includes, for example, a pixel region 10A and a circuit section 130 that drives this pixel region 10A. The circuit section 130 includes, for example, a row scanner 131, a horizontal selector 133, a column scanner 134, and a system controller 132.

The pixel region 10A includes the plurality of pixels P that is, for example, two-dimensionally disposed in a matrix. The pixels P are provided, for example, with a pixel drive line Lread (e.g., a row selection line and a reset control line) for each of the pixel rows and a vertical signal line Lsig for each of the pixel columns. The pixel drive line Lread is for transmitting drive signals for reading out signals from the pixels P. One end of the pixel drive line Lread is coupled to the output end of the row scanner 131 corresponding to each of the rows.

The row scanner 131 includes a shift register, an addresses decoder, and the like. The row scanner 131 is a pixel driver that drives the respective pixels P in an element region R1, for example, row by row. Signals outputted from the respective pixels P in the pixel row selectively scanned by the row scanner 131 are supplied to the horizontal selector 133 through each of the vertical signal lines Lsig. The horizontal selector 133 includes an amplifier, a horizontal selection switch, and the like provided for each of the vertical signal lines Lsig.

The column scanner 134 includes a shift register, an address decoder, and the like. The column scanner 134 drives the respective horizontal selection switches of the horizontal selector 133 in order while scanning the horizontal selection switches. This selective scanning by the column scanner 134 outputs signals of the respective pixels transmitted through each of the vertical signal lines Lsig to a horizontal signal line 135 in order. The signals are inputted to a signal processor or the like through the horizontal signal line 135. The signal processor is not illustrated.

As illustrated in FIG. 12, for example, an element substrate K1 including the pixel region 10A and a circuit substrate K2 including the circuit section 130 are stacked in this imaging device 1. Such a configuration is not, however, limitative. For example, the circuit section 130 may be formed on the same substrate as that of the pixel region 10A or may be provided in external control IC. In addition, the circuit section 130 may be formed on another substrate coupled by a cable or the like.

The system controller 132 receives a clock provided from the outside, data for an instruction about an operation mode, and the like. In addition, the system controller 132 outputs data such as internal information of the imaging device 1. The system controller 132 further includes a timing generator that generates a variety of timing signals and controls the driving of the row scanner 131, the horizontal selector 133, the column scanner 134, and the like on the basis of the variety of timing signals generated by the timing generator.

Application Example 2

The imaging device 1 described above is applicable, for example, to various types of electronic apparatuses such as a camera that is able to image the infrared region. FIG. 13 illustrates a schematic configuration of an electronic apparatus 4 (camera) as an example thereof. This electronic apparatus 4 is, for example, a camera that is able to shoot a still image or a moving image. The electronic apparatus 4 includes the imaging device 1, an optical system (optical lens) 310, a shutter unit 311, a driver 313, and a signal processor 312. The driver 313 drives the imaging device 1 and the shutter unit 311.

The optical system 310 guides image light (incident light) from a subject toward the imaging device 1. This optical system 310 may include a plurality of optical lenses. The shutter unit 311 controls a period in which the imaging device 1 is irradiated with light and a light shielding period. The driver 313 controls a transfer operation of the imaging device 1 and a shutter operation of the shutter unit 311. The signal processor 312 performs various kinds of signal processing on a signal outputted from the imaging device 1. An image signal Dout subjected to the signal processing is stored in a storage medium such as a memory or outputted to a monitor or the like.

Further, the imaging device 1 described in the present embodiment or the like is also applicable to the following electronic apparatuses (a capsule endoscope and a mobile body such as a vehicle).

5. PRACTICAL APPLICATION EXAMPLES

Practical Application Example 1. Endoscopic Surgery System

The technology according to the present disclosure is applicable to a variety of products. For example, the technology according to the present disclosure may be applied to an endoscopic surgery system.

FIG. 14 is a view depicting an example of a schematic configuration of an endoscopic surgery system to which the technology according to an embodiment of the present disclosure (present technology) can be applied.

In FIG. 14, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 15 is a block diagram depicting an example of a functional configuration of the camera head 11102 and the CCU 11201 depicted in FIG. 14.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which the technology according to the present disclosure may be applied has been described above. The technology according to the present disclosure may be applied to the image pickup unit 11402 among the components described above. The application of the technology according to the present disclosure to the image pickup unit 11402 makes it possible to obtain a clearer image of a surgical region. This allows a surgeon to check the surgical region with certainty.

It is to be noted that the endoscopic surgery system has been described here as an example, but the technology according to the present disclosure may be additionally applied, for example, to a microscopic surgery system or the like.

Practical Application Example 2. Mobile Body

The technology according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 16, an audio speaker 12061, a display section 12062, and an instrument panel 12063 are illustrated as the output device. The display section 12062 may, for example, include at least one of an on-board display and a head-up display.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure may be applied has been described above. The technology according to the present disclosure may be applied to the imaging section 12031 among the components described above. The application of the technology according to the present disclosure to the imaging section 12031 makes it possible to obtain a shot image that is easier to see. This makes it possible to decrease the fatigue of a driver.

Further, the imaging device 1 described in the present embodiment or the like is also applicable to electronic apparatuses such as a surveillance camera, a biometric authentication system, and a thermograph. Examples of the surveillance camera include a night vision system (night vision). The application of the imaging device 1 to the surveillance camera makes it possible to recognize a pedestrian, an animal, and the like at night from a distance. In addition, the influence of a headlight and weather is reduced by applying the imaging device 1 as an onboard camera. For example, it is possible to obtain a shot image without being influenced by smoke, fog, or the like. Further, it is also possible to recognize the shape of an object. In addition, the thermograph allows for contactless temperature measurement. The thermograph also allows temperature distribution and heat generation to be detected. Additionally, the imaging device 1 is also applicable to an electronic apparatus that detects fire, moisture, gas, or the like.

Although the description has been given with reference to the first and second embodiments, the modification examples, the application examples, and the practical application examples, the contents of the present disclosure are not limited to the embodiments and the like described above. A variety of modifications are possible. For example, the layer configuration of the light receiver described in the first embodiment described above is an example and another layer may be further included. In addition, the material and the thickness of each of the layers are also examples. Those described above are not limitative.

The effects described in the embodiments or the like described above are examples. The effects may be other effects or may further include other effects.

It is to be noted that the present disclosure may also have configurations as follows. According to the following configurations, light leakage between adjacent pixels is reduced and it is possible to suppress a mixture of colors. This makes it possible to increase the image quality.

(1)
A photoelectric converter including:
a light absorbing layer having a light incidence surface and including a compound semiconductor material;
a first electrode that is provided for each of pixels to be opposed to a surface of the light absorbing layer opposite to the light incidence surface;
a first semiconductor layer of a first electrical conduction type, the first semiconductor layer being provided between the light absorbing layer and the first electrode;
a second semiconductor layer of a second electrical conduction type, the second semiconductor layer being provided between the first semiconductor layer and the light absorbing layer;
a diffusion region of the second electrical conduction type, the diffusion region being provided between the adjacent pixels across the second semiconductor layer and the light absorbing layer;
a groove that separates the first semiconductor layer, the second semiconductor layer, and a portion of the light absorbing layer between the adjacent pixels;
a first insulating film that is continuously provided on a side wall and a bottom surface of the groove; and
a light shielding film that is continuously provided from a side wall of the first semiconductor layer to a side wall of the light absorbing layer with the first insulating film interposed in between.

(2)
The photoelectric converter according to (1), in which the light shielding film is formed by using a single layer film or a stacked film including at least one or more of tungsten, aluminum, ruthenium, indium, cobalt, platinum, or aluminum alloy.

(3)
The photoelectric converter according to (1) or (2), further including a second insulating film that is continuously provided from a surface of the first semiconductor layer to the side wall and the bottom surface of the groove with the light shielding film interposed in between.

(4)
The photoelectric converter according to any one of (1) to (3), in which the first semiconductor layer has band gap energy greater than band gap energy of the light absorbing layer.

(5)
The photoelectric converter according to any one of (1) to (4), in which the second semiconductor layer has band gap energy greater than band gap energy of the light absorbing layer.

(6)
The photoelectric converter according to any one of (1) to (5), in which the diffusion region is provided to have a lattice shape in a plan view.

(7)
The photoelectric converter according to any one of (1) to (6), in which the second semiconductor layer is configured to subject electric charge to avalanche amplification, the electric charge being generated in the light absorbing layer.

(8)
The photoelectric converter according to any one of (1) to (7), further including a second electrode that is provided to be opposed to the light incidence surface of the light absorbing layer.

(9)
The photoelectric converter according to (8), in which the second electrode is provided on a whole of the light incidence surface of the light absorbing layer.

(10)
A photoelectric converter including:
a light absorbing layer having a light incidence surface and including a compound semiconductor material;
a first semiconductor layer of a first electrical conduction type;
a second semiconductor layer of a second electrical conduction type, the second semiconductor layer being provided between the first semiconductor layer and the light absorbing layer;
a diffusion region of the second electrical conduction type, the diffusion region being provided between adjacent pixels across the second semiconductor layer and the light absorbing layer;
a groove that separates the first semiconductor layer, the second semiconductor layer, and a portion of the light absorbing layer between the adjacent pixels; and
a first electrode that is provided for each of the pixels, the first electrode covering a surface of the first semiconductor layer opposite to a surface opposed to the second semiconductor layer and having a light shielding property.

(11)
The photoelectric converter according to (10), in which the first electrode has substantially a same shape as a shape of the first semiconductor layer in a plan view.

(12)
The photoelectric converter according to (10) or (11), in which the first electrode includes a projecting section on a surface opposite to the light absorbing layer.

(13)
The photoelectric converter according to any one of (10) to (12), in which the first electrode is formed by using a single layer film or a stacked film including at least one or more of tungsten, aluminum, ruthenium, indium, cobalt, platinum, or aluminum alloy.

(14)
The photoelectric converter according to any one of (10) to (13), further including a first insulating film that is continuously provided from a side wall of the groove in the second semiconductor layer to a bottom surface of the groove.

(15)
The photoelectric converter according to any one of (10) to (14), further including a second insulating film that is provided on a side wall of the groove, the second insulating film extending from a side wall of the first semiconductor layer onto a portion of a side wall of the second semiconductor layer.

(16)
The photoelectric converter according to any one of (10) to (15), in which the groove is further filled with a third insulating film.

(17)

The photoelectric converter according to (16), further including a coating film that covers the third insulating film from a portion of a surface of the first electrode.

(18)

An imaging device including:

a light absorbing layer having a light incidence surface and including a compound semiconductor material;

a first electrode that is provided for each of pixels to be opposed to a surface of the light absorbing layer opposite to the light incidence surface;

a first semiconductor layer of a first electrical conduction type, the first semiconductor layer being provided between the light absorbing layer and the first electrode;

a second semiconductor layer of a second electrical conduction type, the second semiconductor layer being provided between the first semiconductor layer and the light absorbing layer;

a diffusion region of the second electrical conduction type, the diffusion region being provided between the adjacent pixels across the second semiconductor layer and the light absorbing layer;

a groove that separates the first semiconductor layer, the second semiconductor layer, and a portion of the light absorbing layer between the adjacent pixels;

a first insulating film that is continuously provided on a side wall and a bottom surface of the groove; and a light shielding film that is continuously provided from a side wall of the first semiconductor layer to a side wall of the light absorbing layer with the first insulating film interposed in between.

(19)

An imaging device including:

a light absorbing layer having a light incidence surface and including a compound semiconductor material;

a first semiconductor layer of a first electrical conduction type;

a second semiconductor layer of a second electrical conduction type, the second semiconductor layer being provided between the first semiconductor layer and the light absorbing layer;

a diffusion region of the second electrical conduction type, the diffusion region being provided between adjacent pixels across the second semiconductor layer and the light absorbing layer;

a groove that separates the first semiconductor layer, the second semiconductor layer, and a portion of the light absorbing layer between the adjacent pixels; and a first electrode that is provided for each of the pixels, the first electrode covering a surface of the first semiconductor layer opposite to a surface opposed to the second semiconductor layer and having a light shielding property.

This application claims the priority on the basis of Japanese Patent Application No. 2019-184425 filed with Japan Patent Office on Oct. 7, 2019, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric converter comprising:
a light absorbing layer having a light incidence surface and including a compound semiconductor material;
pixels, wherein
each of the pixels comprises a first electrode,
the first electrode is opposite to a surface of the light absorbing layer, and
the surface of the light absorbing layer is opposite to the light incidence surface;
a first semiconductor layer of a first electrical conduction type, wherein the first semiconductor layer is between the light absorbing layer and the first electrode;
a second semiconductor layer of a second electrical conduction type, wherein the second semiconductor layer is between the first semiconductor layer and the light absorbing layer;
a diffusion region of the second electrical conduction type, wherein the diffusion region is between adjacent pixels across the second semiconductor layer and the light absorbing layer;
a groove that separates the first semiconductor layer, the second semiconductor layer, and a portion of the light absorbing layer between the adjacent pixels;
a first insulating film continuously provided on a side wall and a bottom surface of the groove; and
a light shielding film continuously provided from a side wall of the first semiconductor layer to a side wall of the light absorbing layer with the first insulating film interposed in between,
wherein the first insulating film is in contact with the side wall of the first semiconductor layer, a side wall of the second semiconductor layer, and a side wall of the diffusion region.

2. The photoelectric converter according to claim 1, wherein the light shielding film includes a single layer film or a stacked film of at least one or more of tungsten, aluminum, ruthenium, indium, cobalt, platinum, or aluminum alloy.

3. The photoelectric converter according to claim 1, further comprising a second insulating film continuously provided from a surface of the first semiconductor layer to the side wall and the bottom surface of the groove with the light shielding film interposed in between.

4. The photoelectric converter according to claim 1, wherein the first semiconductor layer has band gap energy greater than band gap energy of the light absorbing layer.

5. The photoelectric converter according to claim 1, wherein the second semiconductor layer has band gap energy greater than band gap energy of the light absorbing layer.

6. The photoelectric converter according to claim 1, wherein the diffusion region has a lattice shape in a plan view.

7. The photoelectric converter according to claim 1, wherein
the second semiconductor layer is configured to subject electric charge to avalanche amplification, and
the electric charge is generated in the light absorbing layer.

8. The photoelectric converter according to claim 1, further comprising a second electrode opposite to the light incidence surface of the light absorbing layer.

9. The photoelectric converter according to claim 8, wherein the second electrode is on a whole of the light incidence surface of the light absorbing layer.

10. A photoelectric converter, comprising:
a light absorbing layer having a light incidence surface and including a compound semiconductor material;
a first semiconductor layer of a first electrical conduction type;
a second semiconductor layer of a second electrical conduction type, wherein the second semiconductor layer is between the first semiconductor layer and the light absorbing layer;
a diffusion region of the second electrical conduction type, wherein the diffusion region is between adjacent pixels across the second semiconductor layer and the light absorbing layer;
a groove that separates the first semiconductor layer, the second semiconductor layer, and a portion of the light absorbing layer between the adjacent pixels;
a first electrode for each of the adjacent pixels, wherein the first electrode covers a first surface of the first semiconductor layer opposite to a second surface of the first semiconductor layer, and the second surface of the first semiconductor layer is opposite to the second semiconductor layer and has a light shielding property; and
a first insulating film in contact with a side wall of the first semiconductor layer, a side wall of the second semiconductor layer, and a side wall of the diffusion region.

11. The photoelectric converter according to claim 10, wherein the first electrode has substantially a same shape as a shape of the first semiconductor layer in a plan view.

12. The photoelectric converter according to claim 10, wherein the first electrode includes a projecting section on a surface opposite to the light absorbing layer.

13. The photoelectric converter according to claim 10, wherein the first electrode includes a single layer film or a stacked film of at least one tungsten, aluminum, ruthenium, indium, cobalt, platinum, or aluminum alloy.

14. The photoelectric converter according to claim 10, wherein the first insulating film that is continuously provided from a side wall of the groove in the second semiconductor layer to a bottom surface of the groove.

15. The photoelectric converter according to claim 10, further comprising a second insulating film on a side wall of the groove, wherein the second insulating film extends from the side wall of the first semiconductor layer onto a portion of the side wall of the second semiconductor layer.

16. The photoelectric converter according to claim 10, wherein the groove includes a third insulating film.

17. The photoelectric converter according to claim 16, further comprising a coating film that covers the third insulating film from a portion of a surface of the first electrode.

18. An imaging device, comprising:
a light absorbing layer having a light incidence surface and including a compound semiconductor material;
pixels, wherein
each of the pixels comprises a first electrode,
the first electrode is opposite to a surface of the light absorbing layer, and
the surface of the light absorbing layer is opposite to the light incidence surface;
a first semiconductor layer of a first electrical conduction type, wherein the first semiconductor layer is-between the light absorbing layer and the first electrode;
a second semiconductor layer of a second electrical conduction type, wherein the second semiconductor layer is between the first semiconductor layer and the light absorbing layer;
a diffusion region of the second electrical conduction type, wherein the diffusion region is between adjacent pixels across the second semiconductor layer and the light absorbing layer;
a groove that separates the first semiconductor layer, the second semiconductor layer, and a portion of the light absorbing layer between the adjacent pixels;
a first insulating film continuously provided on a side wall and a bottom surface of the groove; and
a light shielding film continuously provided from a side wall of the first semiconductor layer to a side wall of the light absorbing layer with the first insulating film interposed in between, wherein the first insulating film is in contact with the side wall of the first semiconductor layer, a side wall of the second semiconductor layer, and a side wall of the diffusion region.

19. An imaging device, comprising:
a light absorbing layer having a light incidence surface and including a compound semiconductor material;
a first semiconductor layer of a first electrical conduction type;
a second semiconductor layer of a second electrical conduction type, wherein the second semiconductor layer is between the first semiconductor layer and the light absorbing layer;
a diffusion region of the second electrical conduction type, wherein the diffusion region is between adjacent pixels across the second semiconductor layer and the light absorbing layer;
a groove that separates the first semiconductor layer, the second semiconductor layer, and a portion of the light absorbing layer between the adjacent pixels;
a first electrode for each of the adjacent pixels, wherein the first electrode covers a first surface of the first semiconductor layer opposite to a second surface of the first semiconductor layer, and the second surface of the first semiconductor layer is opposite-to the second semiconductor layer and has a light shielding property; and
a first insulating film in contact with a side wall of the first semiconductor layer, a side wall of the second semiconductor layer, and a side wall of the diffusion region.

* * * * *